United States Patent
Basting et al.

(10) Patent No.: US 6,717,973 B2
(45) Date of Patent: Apr. 6, 2004

(54) WAVELENGTH AND BANDWIDTH MONITOR FOR EXCIMER OR MOLECULAR FLUORINE LASER

(75) Inventors: Dirk Basting, Fort Lauderdale, FL (US); Sergei Govorkov, Boca Raton, FL (US); Juergen Kleinschmidt, Weissenfels (DE); Peter Lokai, Goettingen (DE); Uwe Stamm, Göttingen (DE)

(73) Assignee: Lambda Physik AG, Goettingen (DE)

(*) Notice: Subject to any disclaimer, the term of this patent is extended or adjusted under 35 U.S.C. 154(b) by 163 days.

(21) Appl. No.: 09/883,097

(22) Filed: Jun. 13, 2001

(65) Prior Publication Data

US 2002/0018505 A1 Feb. 14, 2002

Related U.S. Application Data

(63) Continuation-in-part of application No. 09/715,803, filed on Nov. 17, 2000, now Pat. No. 6,421,365, and a continuation-in-part of application No. 09/657,396, filed on Sep. 8, 2000, now Pat. No. 6,426,966, and a continuation-in-part of application No. 09/599,130, filed on Jun. 22, 2000, now Pat. No. 6,381,256, which is a continuation-in-part of application No. 09/317,527, filed on May 24, 1999, now Pat. No. 6,154,470.
(60) Provisional application No. 60/212,183, filed on Jun. 16, 2000, provisional application No. 60/120,218, filed on Feb. 12, 1999, provisional application No. 60/119,486, filed on Feb. 10, 1999, provisional application No. 60/195,169, filed on Apr. 6, 2000, provisional application No. 60/166,854, filed on Nov. 22, 1999, provisional application No. 60/166,277, filed on Nov. 18, 1999, provisional application No. 60/280,398, filed on Mar. 29, 2001, and provisional application No. 60/140,530, filed on Jun. 23, 1999.

(51) Int. Cl.[7] .............................. H01S 3/20; H01S 3/22; H01S 3/00
(52) U.S. Cl. ..................... 372/52; 372/58; 372/38.02; 372/38.04
(58) Field of Search ................ 372/52.58, 38.02, 372/38.04

(56) References Cited

U.S. PATENT DOCUMENTS

| | | | |
|---|---|---|---|
| 3,806,829 A | 4/1974 | Duston et al. | 331/94.5 |
| 3,868,592 A | 2/1975 | Yarborough et al. | 331/94.5 |
| 4,016,504 A | 4/1977 | Klauminzer | 331/94.5 |
| 4,319,843 A | 3/1982 | Gornall | 356/346 |
| 4,393,505 A | 7/1983 | Fahlen | 372/57 |
| 4,611,270 A | 9/1986 | Klauminzer et al. | 364/183 |
| 4,616,908 A | 10/1986 | King | 350/576 |
| 4,696,012 A | 9/1987 | Harshaw | 372/99 |

(List continued on next page.)

FOREIGN PATENT DOCUMENTS

| | | | |
|---|---|---|---|
| EP | 1 063 503 A1 | 6/2000 | G01J/9/02 |
| JP | 2631554 | 7/1997 | H01S/3/1055 |

OTHER PUBLICATIONS

J.K. Watts, "Theory of Multiplate Resonant Reflectors," *Applied Optics*, Aug. 1968, vol. 7, No. 8, 3 pgs.

Arnold L. Bloom, "Modes of a laser resonator containing tilted birefringent plates," *Journal of the Optical Society of America*, vol. 64, No. 4, Apr. 1974, pp. 447–452.

(List continued on next page.)

*Primary Examiner*—George Eckert
*Assistant Examiner*—Joseph Nguyen
(74) *Attorney, Agent, or Firm*—Stallman & Pollock LLP

(57) ABSTRACT

A $F_2$-laser includes a discharge chamber filled with a gas mixture including molecular fluorine for generating a spectral emission in a wavelength range between 157 nm and 158 nm including a primary line and a secondary line, multiple electrodes coupled with a power supply circuit for producing a pulsed discharge to energize the molecular fluorine, a resonator including the discharge chamber and an interferometric device for generating a laser beam having a bandwidth of less than 1 pm, and a wavelength monitor coupled in a feedback loop with a processor for monitoring a spectral distribution of the laser beam. The processor controls an interferometric spectrum of the interferometric device based on the monitored spectral distribution such that sidebands within the spectral distribution are substantially minimized.

84 Claims, 4 Drawing Sheets

U.S. PATENT DOCUMENTS

| | | | |
|---|---|---|---|
| 4,823,354 A | 4/1989 | Znotins et al. | 372/57 |
| 4,829,536 A | 5/1989 | Kajiyama et al. | 372/57 |
| 4,856,018 A | 8/1989 | Nozue et al. | 372/98 |
| 4,905,243 A | 2/1990 | Lokai et al. | 372/32 |
| 4,911,778 A | 3/1990 | Barnoach | 156/466 |
| 4,914,662 A | 4/1990 | Nakatani et al. | 372/32 |
| 4,926,428 A | 5/1990 | Kajiyama et al. | 372/20 |
| 4,975,919 A | 12/1990 | Amada et al. | 372/33 |
| 4,977,563 A | 12/1990 | Nakatani et al. | 372/32 |
| 5,025,445 A | 6/1991 | Anderson et al. | 372/20 |
| 5,081,635 A | 1/1992 | Wakabayashi et al. | 372/57 |
| 5,095,492 A | 3/1992 | Sandstrom | 372/102 |
| 5,142,543 A | 8/1992 | Wakabayashi et al. | 372/32 |
| 5,150,370 A | 9/1992 | Furuya et al. | 372/106 |
| 5,198,872 A | 3/1993 | Wakabayashi et al. | 356/352 |
| 5,218,421 A | 6/1993 | Wakabayashi et al. | 356/352 |
| 5,221,823 A | 6/1993 | Usui | 219/121.78 |
| 5,226,050 A | 7/1993 | Burghardt | 372/20 |
| 5,325,378 A | 6/1994 | Zorabedian | 372/20 |
| 5,373,515 A | 12/1994 | Wakabayashi et al. | 372/20 |
| 5,404,366 A | 4/1995 | Wakabayashi et al. | 372/29 |
| 5,440,578 A * | 8/1995 | Sandstrom | 372/59 |
| 5,450,207 A | 9/1995 | Fomenkov | 356/416 |
| 5,559,584 A | 9/1996 | Miyaji et al. | 355/73 |
| 5,559,816 A | 9/1996 | Basting et al. | 372/27 |
| 5,642,374 A * | 6/1997 | Wakabayashi et al. | 372/57 |
| 5,646,954 A | 7/1997 | Das et al. | 372/55 |
| 5,684,822 A | 11/1997 | Partlo | 372/95 |
| 5,684,824 A | 11/1997 | Hayakawa | 372/103 |
| 5,761,236 A | 6/1998 | Kleinschmidt et al. | 372/100 |
| 5,763,855 A | 6/1998 | Shioji | 219/121.84 |
| 5,764,678 A | 6/1998 | Tada | 372/57 |
| 5,771,094 A | 6/1998 | Carter et al. | 356/326 |
| 5,811,753 A | 9/1998 | Weick et al. | 219/121.78 |
| 5,856,991 A | 1/1999 | Ershov | 372/57 |
| 5,901,163 A | 5/1999 | Ershov | 372/20 |
| 5,946,337 A | 8/1999 | Govorkov et al. | 372/92 |
| 5,978,391 A | 11/1999 | Das et al. | 372/20 |
| 5,978,394 A | 11/1999 | Newman et al. | 372/32 |
| 6,028,879 A | 2/2000 | Ershov | 372/57 |
| 6,061,382 A | 5/2000 | Govorkov et al. | 372/101 |
| 6,078,599 A | 6/2000 | Everage et al. | 372/20 |
| 6,137,821 A | 10/2000 | Ershov | 372/108 |
| 6,154,470 A | 11/2000 | Basting et al. | 372/19 |
| 6,240,110 B1 | 5/2001 | Ershov | 372/20 |

OTHER PUBLICATIONS

Masakatsu Okada and Shogo Ieiri, "Electronic Tuning of Dye Lasers by an Electrooptic Birefringent Fabry–Perot Etalon," *Optics Communications*, vol. 14, No. 1, May 1975, pp. 4–7.

R.B. Green, et al., "Galvanic Detection of Optical Absorptions in a Gas Discharge," *Applied Physics Letters*, Dec. 1, 1976, vol. 29, No. 11, pp. 727–729.

James K. Rice, A. Kay Hays, and Joseph R. Woodwsorth, "vuv emissions from mixtures of $F_2$ and the noble gasses—A molecular $F_2$ Laser at 1575 Å[a]," *Applied Physics Letters*, vol. 31, No. 1, Jul. 1, 1977, 5 pgs.

S. Saikan, "Nitrogen–Laser–Pumped Single–Mode Dye Laser," *Applied Physics*, 1978, 4 pgs.

Joseph R. Woodworth and James K. Rice, "An efficient, high power $F_2$ laser near 157 nm[a]," *The Journal of Chemical Physics*, vol. 69, Sep. 15, 1978, 11 pgs.

R.A. Keller, et al., "Opto–galvanic Spectroscopy in a Uranium Hollow Cathode Discharge," *J. Opt. Soc. Am.*, May 1979, vol. 69, No. 5, pp. 738–742.

K. Hohla, M. Diegelmann, H. Pummer, K.L. Kompa, "CIF and $F_2$: two new ulra–violet laser systems," *Optics and Laser Technology*, vol. 11, No. 6, Dec. 1979, 6 pgs.

H. Pummer, K. Hohla, M. Diegelmann and J.P. Reilly, "Discharge pumped $F_2$ Laser at 1580 Å", *Optics Communications*, vol. 28, No. 1, Jan. 1979, 6 pgs.

Shin Sumida, Minoru Obara, and Tomoo Fujioka, "Novel neutral atomic fluorine laser lines in a high–pressure mixture of $F_2$ and He," *Journal of Applied Physics*, vol. 50, Jun. 1979, No. 6, 10 pgs.

Richard A. Keller, et al., "Atlas for Optogalvanic Wavelength Calibration," *Applied Optics*, Mar. 15, 1980, vol. 19, No. 6, pp. 836–837.

M.H.R. Hutchinson, "Vacuum ultraviolet excimer lasers," *Applied Optics VUV VI*, vol. 19, No. 23, Dec. 1, 1980, pp. 3883–3888.

R. Sadighi–Bonabi, F.W. Lee, and C.B. Collins, "Gain and saturation of the atomic fluorine laser," *Journal of Applied Physics*, vol. 53, May 1982, No. 5, 11 pgs.

Norman J. Dovichi, et al., "Use of the Optogalvanic Effect and the Uranium Atlas for Wavelength Calibration of Pulsed Lasers," *Applied Optics*, Apr. 15, 1982, vol. 21, No. 8, pp. 1468–1473.

P. Camus, "Atomic Spectroscopy with Optogalvanic Detection," *Journal De Physique*, (Paris) Nov. 1983, 11C7, pp. C7-87–106.

Marilyn J. Dodge, "Refractive Properties of magnesium Fluoride," *Applied Optics*, vol. 23, No. 12, Jun. 15, 1984, pp. 1980–1985.

I.G. Koprinkov, K.V. Stamenov, and K.A. Stankov, "Intense Laser Generation from an Atomic–Fluorine," *Applied Physics*, vol. B33, No. 4, Apr. 1984, 5 pgs.

E. Armandillo, G. Grasso, and G. Salvetti, "Simple, compact, high–repetition rate XeCI laser," *Review of Scientific Instruments*, vol. 56, No. 5, Part 1, May 1985, pp. 674–676.

A.C. Cefalas, C. Skordoulis, M. Kompitasas and C.A. Nicolaides, "Gain Measurements at 157 nm in an $F_2$ Pulsed Discharge Molecular Laser," *Optics Communications*, vol. 55, No. 6, Oct. 15, 1985, 6 pgs.

V.N. Ishchenko, S.A. Kochubei, and A.M. Razhev, "High–power efficient vacuum ultraviolet $F_2$ laser excited by an electric discharge," *Soviet Journal of Quantum Electronics*, 16(5) May 1986, 9 pgs.

F. Babin, et al., "Ultraviolet Optogalvanic Laser Spectroscopy of Iron for Reference Wavelenghts," *Optics Letters*, Jul. 1987, vol. 12, No. 7, pp. 468–470.

W. Muckenheim, et al., "Seven Ways to Combine Two Excimer Lasers," reprinted from Jul. 1987 edition of *Laser Focus/Electro–Optics*.

W. Muckenheim, et al., "Excimer Laser with Narrow Linewidth and Large Internal Beam Divergence," *J. Phys. E. Sci. Instrum.*, 20, 1987, 1934–1935.

Mieko Ohwa and Minoru Obara, "Theoretical evaluation of high–efficiency operation of discharge–pumped vacuum–ultraviolet $F_2$ lasers," *Applied Physics Letters*, vol. 51, No. 13, Sep. 28, 1987, 6 pgs.

ZOS, Akademie der Wissenschaften der DDR, Zentralinstitut fur Optik und Wissenschaften der DDR, Oct. 1987, "Leistungastarker atomarer Fluorlaser im roten Spektralbereich," Jurgen Lademann, Roland Kunig, Wadim Saidow, Rainer Weidauer, 12 pgs.

Koich Wani, Yoshiro Ogata, Yoshiaki Watarai, Takuhiro Ono, Takeo Miyata, Reiji Sano, and Yasuaki Terui, "Narrow–band KrF excimer laser—tunable and wavelength stabilized," *SPIE—The International Society for Optical Engineering, Excimer Beam Applications*, vol. 998, Sep. 6, 1988, Boston, Massachusetts, pp. 2–8.

T. Uematsu et al. Keio U., "Theoretical simulation of a discharge pumped $F_2$ excimer laser," Discharge–Pumped Excimer Laser Research in Japan, Apr. 1988.

Wataru Sasaki, Kou Kurosawa, "Intense VUV–XUV generation from rare gas excimers," *Conference on Lasers and Electro–Optics, 1989 Technical Digest Series*, vol. 11, May 24–28, 1989, Baltimore, Maryland, 23 pgs.

Kawakatsu Yamada, Kenzo Miyazaki, Toshifumi Hasama, and Takuzo Sata, "High–power discharge–pumped $F_2$ molecular laser," *Applied Physics Letters*, vol. 54, Feb. 13, 1989, No. 7.

R.K. Brimacombe, T.J. McKee, E.D. Mortimer, B. Norris, J. Reid, T.A. Znotins, "Line–narrowed indusrial excimer laser for microlithography," *Conference on Lasers and Electro–Optics*, 1989 Techical Digest Series, vol. 11, Apr. 24–29, 1989, Baltimore, Mayland, 24 pgs.

K. Yamada, K. Miyazaki, T. Hasama, T. Sato, M. Kasamatsu, and Y. Mitsuhashi, "High Power Discharge–Pumped $F_2$ Laser," *Leos '89, Lasers and Electro–Optics Society Annual Meeting Conference Proceedings*, Oct. 17–20, 1989, Orlando, Florida, 13 pgs.

Masayuki Kakehata, Etsu Hashimoto, Fumihiko Kannari and Minoru Obara, "High specific output energy operation of a vacuum ultraviolet molecular fluorine laser excited at 66 MW/cm$^3$ by an electric discharge," *Applied Physics Letters*, vol. 56, Jun. 25, 1990, No. 26, 6 pgs.

Kakehata, M. et al., "CTUH15 Experimental Study of Tunability of a Discharge Pumped Molecular Fluorine Laser," *CLEO 90/Tuesday Poster*, pp. 106–108.

K. Komatsu, E. Matsui, S. Takahashi, Fumiko Kannari, M. Obara, "Spectroscopic comparison between low and high pressure discharge pumped Xe atomic lasers," *Conference on Lasers and Electro–optics, 1990 Technical Digest Series*, vol. 7, May 21–25, 1990, Anaheim, California, 30 pgs.

Science Report, LAMBDAPHYSIK, No. 3, Nov. 1990, "Breakthrough in $F_2$Laser Technology," 4 pgs.

Masayuki Kakehata, Etsu Hashimoto, Fumihiko Kannari, and Minoru Obara, "Frequency up–conversion of a discharge pumped molecular fluorine laser by stimulted Raman scattering in $H_2$," *Gas Flow and Chemical Lasers, SPIE* vol. 1397, Sep. 10–14, 1990, pp. 185–189.

Verhandlungen, Mar. 1990, Phsyikertagung Munchen, 1990, Optimierung der VUV–Emission bei 157 nm ($F_2$–Linie) bei entladungs—gepemten Excimerlasern, F. Voss, 2 pgs.

C. Skordoulis, E. Sarantopoulou, S. Spyrou and A.C. Cefalas, "Amplification characteristics of a discharge excited $F_2$ laser," *Journal of Modern Optics*, vol. 37, No. 4, Apr. 1990, 12 pgs.

Tagungsband, Vom. 24, Bis. 26, Sep. 1991, Abstract: "Vakuum UV Molekullaser mit hoher Ausgangsleistung," 3 pgs.

Highlights Lambda Physik, No. 29, Jun. 1991, "VUV Spectroscopy by Frequency Tripling," 6 pgs.

R. Sandstrom, "Argon Fluoride Excimer Laser Source for Sub–0.25 mm Optical Lithography," *Optical/Laser Microlithography IV*, 1991, vol. 1463, pp. 610–616.

C. Momma, A. Tunnermann, F. Voss, C. Windolph and B. Wellegehausen, "Stimulated Raman scattering of a $F_2$–Laser in $H_2$," *Institut Fur Quantenoptik*, Oct. 22, 1991, 8 pgs.

Masayuki Kakehata, Tatsuya Uematsu, Fumihiko Kannari, and Minoru Obara, "Efficiency Characterization of Vacuum Ultraviolet Molecular Flurorine ($F_2$) Laser (157 nm) Excited by an Intense Electric Discharge," *IEEE Journal of Quantum Electronics*, Nov. 1991, vol. 27, No. 11, 10 pgs.

Highlights, Lambda Physik, No. 33, Feb. 1992, "VUV Stokes and Anti–Stokes Raman Lines Derived from an $F_2$ Laser," C. Momma, A. Tunermann, F. Voss, C. Windolph, and B. Wellegehausen, 5 pgs.

S.M. Hooker, A.M. Haxell, and C.E. Webb, "Influence of Cavity Configuration on the Pulse Energy of a High–Pressure Molecular Fluorine Laser," *Applied Physics B Photo–physics and Laser Chemistry*, vol. B55, No. 1, Jul. 1992, pp. 54–59.

Highlights Lambda Physik, Apr. 1993, "Excimer laser based microstructuring using mask projection techniques," U. Sarbach and H.J. Kahlert, pp. 1–4.

H.M.J. Bastiaens, B.MN.C. van Dam, P.J.M. Peters, and W.J. Witteman, *Applied Physics Letters*, vol. 63, No. 4, Jul 26, 1993, "Small–signal gain measurements in an electron beam pumped $F_2$ laser," 7 pgs.

High Power Laser & Particle Beams, vol. 6, No. 4, Series No. 24, Nov. 15, 1994.

Highlights, Lambda Physik, No. 43, Jan. 1994, "Photochemical modification of Fluorocarbon Resin to Generate Adhesive Properties," 6 pgs.

F.T.J.L. Lankhorst, H.M.J. Bastiaens, H. Botma, P.J.M. Peters, and W.J. Witteman, "Long pulse electron beam pumped molecular $F_2$Laser," *Journal of Applied Physics*, vol. 77, Jan. 1–15, 1995, 8 pgs.

H.J. Eichler, et al., "Effective Etalon Reflectors with High Damage Threshold for Erbium Laser Development," *CLEO '96—Conference on Lasers and Electro–Optics*, pp. 147–148.

G. Grunefeld, et al., "Operation of KrF and ArF Tunable Excimer Lasers without Cassegrain Optics," *Applied Physics B*, vol. 62, 1996, pp. 241.

Tahei Kitamura, Yoshihiko Arita and Keisuke Maeda, Masayuki Takasaki, Kenshi Nakamura, Yoshiano Fujiwara and Shiro Horiguchi, "Small–signal gain measurements in a discharge–pumped $F_2$ laser," *Journal of Applied Physics*, vol. 81, No. 6, Mar. 1997 12 pgs.

T. Hofmann, et al., "Revisiting the F2 Laser for DUV Microlithography," *Proceedings of SPIE: Optical Microlithography XII*, vol. 3679, Mar. 14–19, 1999, Santa Clara, CA, USA, pp. 541–546.

Uwe Stamm, et al., "Excimer Laser for 157 nm Lithography," 24th *International Symposium on Microlithography*, Mar. 14–19, 1999, Santa Clara, CA, USA, pp. 816–826.

T. Hofmann, et al., "Prospects of High Repetition Rate F2 (157 nm) Laser for Microlithography," *International SEMATECH Workshop*, Feb. 15–17, 1999, Litchfield, AZ, USA.

Uwe Stamm, et al., "Status of 157 nm Excimer Laser," *International SEMATECH Workshop*, Feb. 15–17, 1999, Litchfield, AZ, USA.

D. Basting, U. Sowada, F. Voss, P. Oesterlin, "Processing of PTFE with High Power VUV Laser Radiation,".

* cited by examiner

WAVELENGTH AND BANDWIDTH MONITOR FOR EXCIMER OR MOLECULAR FLUORINE LASER

PRIORITY

This Application claims the benefit of priority to U.S. Provisional Application No. 60/212,183, filed Jun. 16, 2000, and this application which claims the benefit of priority to U.S. patent application Ser. No. 09/657,396, filed Sep. 8, 2000 now U.S. Pat. No. 6,426,966, which is a Continuation-in-Part of Ser. No. 09/317,527 claiming the benefit of priority to U.S. Pat. No. 6,154,470, filed May 24, 1999, which claims the benefit of priority to U.S. provisional patent applications no. 60/120,218, filed Feb. 12, 1999 and 60/119,486, filed Feb. 10, 1999, and this application is a Continuation-in-Part application which claims the benefit of priority U.S. patent application Ser. No. 09/715,803 now U.S. Pat. No. 6,421,365, filed Nov. 17, 2000, which claims the benefit of priority to U.S. provisional patent applications No. 60/195,169, filed Apr. 6, 2000, 60/166,854, filed Nov. 22, 1999, and 60/166,277, filed Nov. 18, 1999, and this application claims the benefit of priority to U.S. provisional patent application No. 60/280,398, filed Mar. 29, 2001, and this application is a Continuation-in-Part application which claims the benefit of priority U.S. patent application Ser. No. 09/599,130, now U.S. Pat. No. 6,381,256, filed Jun. 22, 2000, which claims the benefit of priority to U.S. provisional patent application No. 60/140,530, filed Jun. 23, 1999.

BACKGROUND OF THE INVENTION

1. Field of the Invention

The invention relates to a molecular fluorine ($F_2$) laser, and particularly to an $F_2$-laser having enhanced efficiency, line-selection and line-narrowing of the selected line, and wavelength control.

2. Discussion of the Related Art

Semiconductor manufacturers are currently using deep ultraviolet (DUV) lithography tools based on KrF-excimer laser systems operating around 248 nm, and next generation ArF-excimer laser systems operating around 193 nm. Vacuum UV (VUV) lithography may use the $F_2$-laser operating around 157 nm.

The emission of the $F_2$-laser includes at least two characteristic lines around $\lambda_1=157.629$ nm and $\lambda_2=157.523$ nm. Each line has a natural linewidth of around 15 pm (0.015 nm). The intensity ratio between the two lines is $|(\lambda_1)/|(\lambda_2)\approx 7$. See V. N. Ishenko, S. A. Kochubel, and A. M. Razher, Sov. Journ. QE-16, 5 (1986). FIG. 1 illustrates the two above-described closely-spaced peaks of the $F_2$-laser spontaneous emission spectrum.

Integrated circuit device technology has entered the sub-quarter regime, thus necessitating very fine photolithographic techniques. Line narrowing and tuning is required in KrF- and ArF-excimer laser systems due to the breadth of their natural emission spectra (>100 pm). Narrowing of the linewidth is achieved most commonly in these laser systems through the use of a wavelength selector consisting of one or more prisms and a diffraction grating (Littrow configuration). However, for an $F_2$-laser operating at a wavelength of approximately 157 nm, use of a reflective diffraction grating may be unsatisfactory due to its low reflectivity and high oscillation threshold at this wavelength. In this regard, a master oscillator-power amplifier design has been proposed by two of the Applicants of the present application (see U.S. patent application Ser. No. 09/599,130, which is assigned to the same assignee as the present application and is hereby incorporated by reference) for improving the power of the output beam and enabling very narrow linewidths (<1 pm), e.g., using a diffraction grating and or etalons, each preferably in combination with a beam expander. The tunability of the $F_2$-laser has been demonstrated using a prism inside the laser resonator. See M. Kakehata, E. Hashimoto, F. Kannari, M. Obara, U. Keio Proc. of CLEO-90, 106 (1990). It is desired to provide a 157 nm beam from a narrow band $F_2$ laser at a controlled wavelength.

$F_2$-lasers are also characterized by relatively high intra-cavity losses, due to absorption and scattering in gases and all optical elements, particularly in oxygen and water vapor which absorb strongly around 157 nm. The short wavelength (157 nm) is responsible for the high absorption and scattering losses of the $F_2$-laser, whereas the KrF-excimer laser operating at 248 nm, e.g., does not experience such losses. Therefore, the advisability of taking steps to optimize resonator efficiency is recognized herein.

SUMMARY OF THE INVENTION

It is therefore an object of the invention to provide a $F_2$-laser wherein one of the plural emission lines around 157 nm is efficiently selected.

It is a further object of the invention to provide a $F_2$-laser with efficient means for narrowing the selected line.

It is a further object of the invention to provide a $F_2$-laser with line-selection and line-narrowing of the selected line, wherein the output wavelength is controlled.

In view of these and other objects, a $F_2$-laser is provided including a discharge chamber filled with a gas mixture including molecular fluorine for generating a spectral emission including multiple closely spaced lines in a wavelength range between 157 nm and 158 nm including a primary line and a secondary line, multiple electrodes coupled with a power supply circuit for producing a pulsed discharge to energize the molecular fluorine, and a resonator including the discharge chamber, a transmissive interferometric device and a pair of resonator reflectors for generating a laser beam having a bandwidth of less than 1 pm. The interferometric device is configured for maximum transmissivity of a selected portion of the primary line and for relatively low transmissivity of the secondary line and an unselected portion of the primary line to substantially suppress the secondary line and the unselected portion of the primary line, thereby selecting and narrowing the primary line such that the $F_2$-laser emits a single wavelength laser beam having a narrow spectral bandwidth that is less than the bandwidth of the primary line of a free-running $F_2$-laser to provide a narrow band VUV laser beam.

A $F_2$-laser is further provided including a discharge chamber filled with a gas mixture including molecular fluorine for generating a spectral emission including multiple closely spaced lines in a wavelength range between 157 nm and 158 nm including a primary line and a secondary line, multiple electrodes coupled with a power supply circuit for producing a pulsed discharge to energize the molecular fluorine, and a resonator including the discharge chamber, a reflective interferometric device, and another resonator reflector for generating a laser beam having a bandwidth of less than 1 pm. The interferometric device is configured for maximum reflectivity of a selected portion of the primary line and for relatively low reflectivity of the secondary line and an unselected portion of the primary line to substantially suppress the secondary line and the unselected portion of said primary line, thereby selecting and narrowing the primary line such that the $F_2$-laser emits a single wavelength laser beam having a narrow spectral bandwidth that is less than the bandwidth of the primary line of a free-running $F_2$-laser to provide a narrow band VUV laser beam.

A $F_2$-laser is also provided including a discharge chamber filled with a gas mixture including molecular fluorine for generating a spectral emission including multiple closely spaced lines in a wavelength range between 157 nm and 158 nm including a primary line and a secondary line, multiple electrodes coupled with a power supply circuit for producing a pulsed discharge to energize the molecular fluorine, and a resonator including the discharge chamber, a transmissive interferometric device, and a pair of resonator reflectors for generating a laser beam having a bandwidth of less than 1 pm. The interferometric device is configured for maximum transmissivity of the primary line and for relatively low transmissivity of the secondary line to substantially suppress the secondary line, thereby selecting the primary line such that the $F_2$-laser emits a single wavelength laser beam having a narrow spectral bandwidth that is less than the bandwidth of a free-running $F_2$-laser to provide a narrow band VUV laser beam.

A $F_2$-laser is further provided including a discharge chamber filled with a gas mixture including molecular fluorine for generating a spectral emission including multiple closely spaced lines in a wavelength range between 157 nm and 158 nm including a primary line and a secondary line, multiple electrodes coupled with a power supply circuit for producing a pulsed discharge to energize the molecular fluorine, and a resonator including the discharge chamber, a reflective interferometric device, and another resonator reflector for generating a laser beam having a bandwidth of less than 1 pm. The interferometric device is configured for maximum reflectivity of the primary line and for relatively low reflectivity of the secondary line to substantially suppress the secondary line, thereby selecting the primary line such that the $F_2$-laser emits a single wavelength laser beam having a narrow spectral bandwidth that is less than the bandwidth of a free-running $F_2$-laser to provide a narrow band VUV laser beam.

A $F_2$-laser is also provided including a discharge chamber filled with a gas mixture including molecular fluorine for generating a spectral emission including multiple closely spaced lines in a wavelength range between 157 nm and 158 nm including a primary line and a secondary line, multiple electrodes coupled with a power supply circuit for producing a pulsed discharge to energize the molecular fluorine, and a resonator including the discharge chamber, a transmissive interferometric device, a dispersive optic and a pair of resonator reflectors for generating a laser beam having a bandwidth of less than 1 pm. The dispersive optic is arranged at a particular orientation for dispersing the multiple closely-spaced lines including the primary and secondary lines such that only the primary line remains within an acceptance angle of the resonator and any other line(s) including the secondary line are dispersed outside of the acceptance angle of the resonator. The interferometric device is configured for maximum transmissivity of a selected portion of the primary line and for relatively low transmissivity of an unselected portion of the primary line to substantially suppress the unselected portion of said primary line. The dispersive optic and interferometric device thereby select and narrow the primary line such that the $F_2$-laser emits a single wavelength laser beam having a narrow spectral bandwidth that is less than the bandwidth of the primary line of a free-running $F_2$-laser to provide a narrow band VUV laser beam.

A $F_2$-laser is also provided including a discharge chamber filled with a gas mixture including molecular fluorine for generating a spectral emission including multiple closely spaced lines in a wavelength range between 157 nm and 158 nm including a primary line and a secondary line, multiple electrodes coupled with a power supply circuit for producing a pulsed discharge to energize the molecular fluorine, and a resonator including the discharge chamber, a reflective interferometric device, a dispersive optic and another resonator reflector for generating a laser beam having a bandwidth of less than 1 pm. The dispersive optic is arranged at a particular orientation for dispersing multiple closely-spaced lines including the primary and secondary lines such that only the primary line remains within an acceptance angle of the resonator any other line(s) including the secondary line are dispersed outside of the acceptance angle of the resonator. The interferometric device is configured for maximum reflectivity of a selected portion of the primary line and for relatively low reflectivity of an unselected portion of the primary line to substantially suppress the unselected portion of the primary line. The dispersive optic and interferometric device thereby select and narrow the primary line such that the $F_2$-laser emits a single wavelength laser beam having a narrow spectral bandwidth that is less than the bandwidth of the primary line of a free-running $F_2$-laser to provide a narrow band VUV laser beam.

A $F_2$-laser is also provided including a discharge chamber filled with a gas mixture including molecular fluorine for generating a spectral emission including multiple closely spaced lines in a wavelength range between 157 nm and 158 nm including a primary line and a secondary line, multiple electrodes coupled with a power supply circuit for producing a pulsed discharge to energize the molecular fluorine, and a resonator including the discharge chamber and an interferometric device for generating a laser beam having a bandwidth of less than 1 pm. The interferometric device is configured for relatively suppressing the secondary line and a portion of the primary line other than a selected portion of the primary line to substantially suppress the secondary line and the unselected portion of the primary line compared with the selected portion of the primary line, thereby selecting and narrowing the primary line such that the $F_2$-laser emits a single wavelength laser beam having a narrow spectral bandwidth that is less than the bandwidth of the primary line of a free-running $F_2$-laser to provide a narrow band VUV laser beam.

A $F_2$-laser is further provided including a discharge chamber filled with a gas mixture including molecular fluorine for generating a spectral emission including multiple closely spaced lines in a wavelength range between 157 nm and 158 nm including a primary line and a secondary line, multiple electrodes coupled with a power supply circuit for producing a pulsed discharge to energize the molecular fluorine, and a resonator including the discharge chamber and an interferometric device for generating a laser beam having a bandwidth of less than 1 pm. The interferometric device is configured for relatively suppressing the secondary line to substantially suppress the secondary line compared with the primary line, thereby selecting the primary line such that the $F_2$-laser emits a single wavelength laser beam having a narrow spectral bandwidth that is less than the bandwidth of a free-running $F_2$-laser to provide a narrow band VUV laser beam.

A $F_2$-laser is further provided including a discharge chamber filled with a gas mixture including molecular fluorine for generating a spectral emission including multiple closely spaced lines in a wavelength range between 157 nm and 158 nm including a primary line and a secondary line, multiple electrodes coupled with a power supply circuit for producing a pulsed discharge to energize the molecular fluorine, and a resonator including the discharge chamber, an interferometric device and a dispersive optic for generating a laser beam having a bandwidth of less than 1 pm. The dispersive optic is arranged at a particular orientation for dispersing the multiple closely-spaced lines including the primary and secondary lines such that only the primary line remains within an acceptance angle of the resonator any other line(s) including the secondary line are dispersed outside of the acceptance angle of the resonator. The interferometric device is configured for relatively suppressing an unselected portion of the primary line to substantially suppress the unselected portion of the primary line. The dispersive optic and interferometric device thereby select and narrow the primary line such that the $F_2$-laser emits a single wavelength laser beam having a narrow spectral bandwidth that is less than the bandwidth of the primary line of a free-running $F_2$-laser to provide a narrow band VUV laser beam.

A $F_2$-laser is further provided including a discharge chamber filled with a gas mixture including molecular fluorine for generating a spectral emission including multiple closely spaced lines in a wavelength range between 157 nm and 158 nm including a primary line and a secondary line, multiple electrodes coupled with a power supply circuit for producing a pulsed discharge to energize said molecular fluorine, and a resonator including the discharge chamber and an interferometric device for generating a laser beam having a bandwidth of less than 1 pm. The interferometric device is configured for relatively suppressing the secondary line and an unselected portion of the primary line to substantially suppress the secondary line and the unselected portion of the primary line compared with a selected portion of the primary line, thereby selecting and narrowing the primary line such that the $F_2$-laser emits a single wavelength laser beam having a narrow spectral bandwidth that is less than the bandwidth of the primary line of a free-running $F_2$-laser to provide a narrow band VUV laser beam. A wavelength monitor is coupled in a feedback loop with a processor for monitoring a spectral distribution of the laser beam. The processor controls an interferometric spectrum of interferometric device based on the monitored spectral distribution such that sidebands within the spectral distribution are substantially minimized.

A $F_2$-laser is also provided including a discharge chamber filled with a gas mixture including molecular fluorine for generating a spectral emission including multiple closely spaced lines in a wavelength range between 157 nm and 158 nm including a primary line and a secondary line, multiple electrodes coupled with a power supply circuit for producing a pulsed discharge to energize the molecular fluorine, and a resonator including the discharge chamber and an interferometric device for generating a laser beam having a bandwidth of less than 1 pm. The interferometric device is configured for relatively suppressing the secondary line to substantially suppress the secondary line compared with the primary line, thereby selecting the primary line such that the $F_2$-laser emits a single wavelength laser beam having a narrow spectral bandwidth that is less than the bandwidth of a free-running $F_2$-laser to provide a narrow band VUV laser beam. The wavelength monitor is coupled in a feedback loop with a processor for monitoring a spectral distribution of the laser beam. The processor controls an interferometric spectrum of the interferometric device based on the monitored spectral distribution such that sidebands within the spectral distribution are substantially minimized.

A $F_2$-laser is further provided including a discharge chamber filled with a gas mixture including molecular fluorine for generating a spectral emission including multiple closely spaced lines in a wavelength range between 157 nm and 158 nm including a primary line and a secondary line, multiple electrodes coupled with a power supply circuit for producing a pulsed discharge to energize the molecular fluorine, and a resonator including the discharge chamber, an interferometric device and a dispersive optic for generating a laser beam having a bandwidth of less than 1 pm. The dispersive optic is arranged at a particular orientation for dispersing the multiple closely-spaced lines including the primary and secondary lines such that only the primary line remains within an acceptance angle of the resonator and any other line(s) including the secondary line are dispersed outside of the acceptance angle of the resonator. The interferometric device is configured for relatively suppressing an unselected portion of the primary line to substantially suppress the unselected portion of the primary line. The dispersive optic and interferometric device thereby select and narrow the primary line such that the $F_2$-laser emits a single wavelength laser beam having a narrow spectral bandwidth that is less than the bandwidth of the primary line of a free-running $F_2$-laser to provide a narrow band VUV laser beam. A wavelength monitor is coupled in a feedback loop with a processor for monitoring a spectral distribution of the laser beam. The processor controls an interferometric spectrum of the interferometric device based on the monitored spectral distribution such that sidebands within the spectral distribution are substantially minimized.

INCORPORATION BY REFERENCE

What follows is a cite list of references each of which is, in addition to those references cited above in the priority section, hereby incorporated by reference into the detailed description of the preferred embodiment below, as disclosing alternative embodiments of elements or features of the preferred embodiments not otherwise set forth in detail below. A single one or a combination of two or more of these references may be consulted to obtain a variation of the preferred embodiments described in the detailed description below. Further patent, patent application and non-patent references are cited in the written description and are also incorporated by reference into the preferred embodiment with the same effect as just described with respect to the following references:

U.S. patent application Ser. Nos. 09/453,670, 09/447,882, 09/317,695, 09/574,921, 09/512,417, 09/599,130, 09/694,246, 09/712,877, 09/738,849, 09/718,809, 09/733,874, 09/780,124, 09/715,803, 60/212,301, 60/212,257, 60/267,567, each of which is assigned to the same assignee as the present application; and U.S. Pat. Nos. 6,154,470, 6,157,662, 6,219,368, 6,028,879, 6,240,110 and 5,901,163; and E. Hecht, Optics, Addison-Wesley, ch. 8–9 (1987);

W. C. Driscoll, ed., Handbook of Optics, McGraw-Hill, pp. 8–111; (1978);

Bloom, "Modes of a Laser Resonator Containing Filtered Birefringent Plates", J. Opt. Soc. Am., 64, p. 447 (1974); and all patent, patent application and non-patent references mentioned in the background or specification of this application.

DETAILED DESCRIPTION OF THE PREFERRED EMBODIMENT

Figure 1:
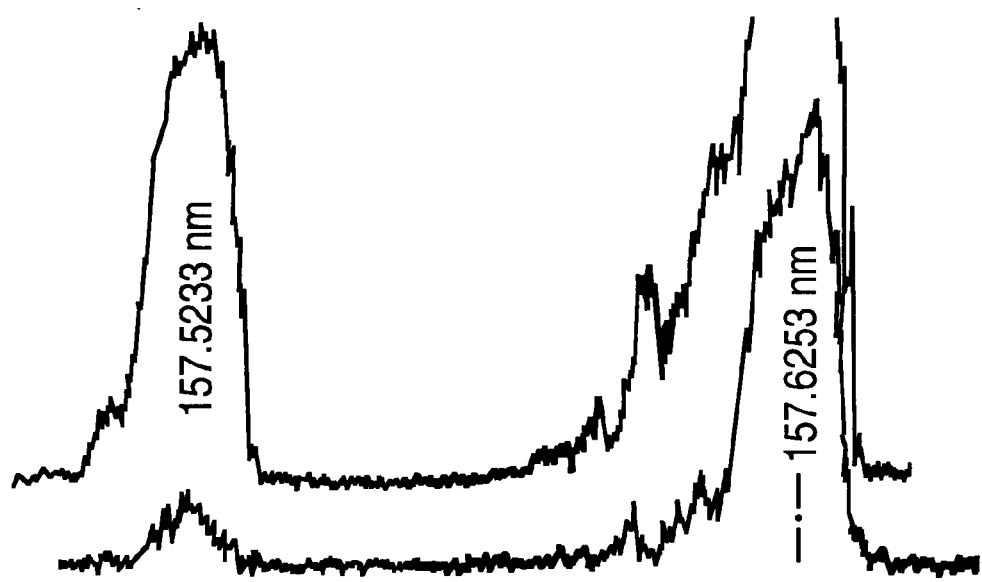
FIG. 1 shows an emission spectrum of an $F_2$-laser without line selection or narrowing.

Referring to FIG. 1, an excimer or molecular fluorine laser system is schematically shown according to a preferred embodiment. The preferred gas discharge laser system is a VUV laser system, such as a molecular fluorine ($F_2$) laser system, for use with a vacuum ultraviolet (VUV) lithography system. Alternative configurations for laser systems for use in such other industrial applications as TFT annealing, photoablation and/or micromachining, e.g., include configurations understood by those skilled in the art as being similar to and/or modified from the system shown in FIG. 1 to meet the requirements of that application. For this purpose, alternative DUV or VUV laser system and component configurations are described at U.S. patent application Ser. Nos. 09/317,695, 09/130,277, 09/244,554, 09/452,353, 09/512,417, 09/599,130, 09/694,246, 09/712,877, 09/574,921, 09/738,849, 09/718,809, 09/629,256, 09/712,367, 09/771,366, 09/715,803, 09/738,849, 60/202,564, 60/204,095, 09/741,465, 09/574,921, 09/734,459, 09/741,465, 09/686,483, 09/715,803, and 09/780,124, and U.S. Pat. Nos. 6,005,880, 6,061,382, 6,020,723, 5,946,337, 6,014,206, 6,157,662, 6,154,470, 6,160,831, 6,160,832, 5,559,816, 4,611,270, 5,761,236, 6,212,214, 6,154,470, and 6,157,662, each of which is assigned to the same assignee as the present application and is hereby incorporated by reference.

The system shown in FIG. 1 generally includes a laser chamber 102 (or laser tube including a heat exchanger and fan for circulating a gas mixture within the chamber 102 or tube) having a pair of main discharge electrodes 103 connected with a solid-state pulser module 104, and a gas handling module 106. The gas handling module 106 has a valve connection to the laser chamber 102 so that halogen and A buffer gas or buffer gases, and optionally a gas additive, may be injected or filled into the laser chamber, preferably in premixed forms (see U.S. patent application Ser. No. 09/513,025, which is assigned to the same assignee as the present application, and U.S. Pat. Nos. 4,977,573 and 6,157,662, which are each hereby incorporated by reference. The solid-state pulser module 104 is powered by a high voltage power supply 108. A thyratron pulser module may alternatively be used. The laser chamber 102 is surrounded by optics module 110 and optics module 112, forming a resonator. The optics modules 110 and 112 may be controlled by an optics control module 114, or may be alternatively directly controlled by a computer or processor 116, particular when line-narrowing optics are included in one or both of the optics modules 110, 112, such as is preferred when KrF, ArF or $F_2$ lasers are used for optical lithography.

The processor 116 for laser control receives various inputs and controls various operating parameters of the system. A diagnostic module 118 receives and measures one or more parameters, such as pulse energy, average energy and/or power, and preferably wavelength, of a split off portion of the main beam 120 via optics for deflecting a small portion of the beam toward the module 118, such as preferably a beam splitter module 122. The beam 120 is preferably the laser output to an imaging system (not shown) and ultimately to a workpiece (also not shown) such as particularly for lithographic applications, and may be output directly to an application process. The laser control computer 116 may communicate through an interface 124 with a stepper/scanner computer, other control units 126, 128 and/or other external systems.

The laser chamber 102 contains a laser gas mixture and includes one or more preionization electrodes (not shown) in addition to the pair of main discharge electrodes 103. Preferred main electrodes 103 are described at U.S. patent application Ser. No. 09/453,670 for photolithographic applications, which is assigned to the same assignee as the present application and is hereby incorporated by reference, and may be alternatively configured, e.g., when a narrow discharge width is not preferred. Other electrode configurations are set forth at U.S. Pat. Nos. 5,729,565 and 4,860,300, each of which is assigned to the same assignee, and alternative embodiments are set forth at U.S. Pat. Nos. 4,691,322, 5,535,233 and 5,557,629, all of which are hereby incorporated by reference. Preferred preionization units are set forth at U.S. patent application Ser. Nos. 09/692,265 (particularly preferred for KrF, ArF, $F_2$ lasers), 09/532,276 and 09/247,887, each of which is assigned to the same assignee as the present application, and alternative embodiments are set forth at U.S. Pat. Nos. 5,337,330, 5,818,865 and 5,991,324, all of the above patents and patent applications being hereby incorporated by reference.

The solid-state or thyratron pulser module 104 and high voltage power supply 108 supply electrical energy in compressed electrical pulses to the preionization and main electrodes 103 within the laser chamber 102 to energize the gas mixture. Components of the preferred pulser module and high voltage power supply may be described at U.S. patent application Ser. Nos. 09/640,595, 60/198,058, 60/204,095, 09/432,348 and 09/390,146, and U.S. Pat. Nos. 6,005,880, 6,226,307 and 6,020,723, each of which is assigned to the same assignee as the present application and which is hereby incorporated by reference into the present application. Other alternative pulser modules are described at U.S. Pat. Nos. 5,982,800, 5,982,795, 5,940,421, 5,914,974, 5,949,806, 5,936,988, 6,028,872, 6,151,346 and 5,729,562, each of which is hereby incorporated by reference.

The laser resonator which surrounds the laser chamber 102 containing the laser gas mixture includes optics module 110 preferably including line-narrowing optics for a line narrowed excimer or molecular fluorine laser such as for photolithography, which may be replaced by a high reflectivity mirror or the like in a laser system wherein either line-narrowing is not desired (for TFT annealling, e.g.), or if line narrowing is performed at the front optics module 112, or a spectral filter external to the resonator is used, or if the line-narrowing optics are disposed in front of the HR mirror, for narrowing the bandwidth of the output beam. In accord with a preferred embodiment herein, optics for selecting one of multiple lines around 157 nm may be used, e.g., one or more dispersive prisms, birefringent plates or blocks and/or an interferometric device such as an etalon or a device having a pair of opposed non-parallel plates such as described in the Ser. No. 09/715,803 application, wherein the same optic or optics or an additional line-narrowing optic or optics for narrowing the selected line may be used. The total gas mixture pressure may be lower than conventional systems, e.g., lower than 3 bar, for producing the selected line at a narrow bandwidth such as 0.5 pm or less without using additional line-narrowing optics (see U.S. patent application Ser. No. 60/212,301, which is assigned to the same assignee as the present application and is hereby incorporated by reference).

The laser chamber 102 is sealed by windows transparent to the wavelengths of the emitted laser radiation 120. The windows may be Brewster windows or may be aligned at another angle, e.g., 5°, to the optical path of the resonating beam. One of the windows may also serve to output couple the beam or as a highly reflective resonator reflector on the opposite side of the chamber 102 as the beam is outcoupled.

After a portion of the output beam 120 passes the outcoupler of the optics module 112, that output portion preferably impinges upon a beam splitter module 122 which includes optics for deflecting a portion of the beam to the diagnostic module 118, or otherwise allowing a small portion of the outcoupled beam to reach the diagnostic module 118, while a main beam portion 120 is allowed to continue as the output beam 120 of the laser system (see U.S. patent application Ser. Nos. 09/771,013, 09/598,552, and 09/712, 877 which are assigned to the same assignee as the present invention, and U.S. Pat. No. 4,611,270, each of which is hereby incorporated by reference. Preferred optics include a beamsplitter or otherwise partially reflecting surface optic. The optics may also include a mirror or beam splitter as a second reflecting optic. More than one beam splitter and/or HR mirror(s), and/or dichroic mirror(s) may be used to direct portions of the beam to components of the diagnostic module 118. A holographic beam sampler, transmission grating, partially transmissive reflection diffraction grating, grism, prism or other refractive, dispersive and/or transmissive optic or optics may also be used to separate a small beam portion from the main beam 120 for detection at the diagnostic module 118, while allowing most of the main beam 120 to reach an application process directly or via an imaging system or otherwise. These optics or additional optics may be used to filter out visible radiation such as the red emission from atomic fluorine in the gas mixture from the split off beam prior to detection.

The output beam 120 may be transmitted at the beam splitter module while a reflected beam portion is directed at the diagnostic module 118, or the main beam 120 may be reflected, while a small portion is transmitted to the diagnostic module 118. The portion of the outcoupled beam which continues past the beam splitter module is the output beam 120 of the laser, which propagates toward an industrial or experimental application such as an imaging system and workpiece for photolithographic applications.

Particularly for the molecular fluorine laser system, and for the ArF laser system, an enclosure (not shown) preferably seals the beam path of the beam 120 such as to keep the beam path free of photoabsorbing species. Smaller enclosures preferably seal the beam path between the chamber 102 and the optics modules 110 and 112 and between the beam splitter 122 and the diagnostic module 118. Preferred enclosures are described in detail in U.S. patent application Ser. Nos. 09/598,552, 09/594,892, 09/727,600 and 09/131, 580, which are assigned to the same assignee and are hereby incorporated by reference, and U.S. Pat. Nos. 6,219,368, 5,559,584, 5,221,823, 5,763,855, 5,811,753 and 4,616,908, all of which are hereby incorporated by reference.

The diagnostic module 118 preferably includes at least one energy detector. This detector measures the total energy of the beam portion that corresponds directly to the energy of the output beam 120 (see U.S. Pat. Nos. 4,611,270 and 6,212,214 which are hereby incorporated by reference). An optical configuration such as an optical attenuator, e.g., a plate or a coating, or other optics may be formed on or near the detector or beam splitter module 122 to control the intensity, spectral distribution and/or other parameters of the radiation impinging upon the detector (see U.S. patent application Ser. Nos. 09/172,805, 09/741,465, 09/712,877, 09/771,013 and 09/771,366, each of which is assigned to the same assignee as the present application and is hereby incorporated by reference).

One other component of the diagnostic module 118 is preferably a wavelength and/or bandwidth detection component such as a monitor etalon or grating spectrometer (see discussion below with reference to FIGS. 5–6 herein, and U.S. patent application Ser. Nos. 09/416,344, 09/686,483, and 09/791,431, each of which is assigned to the same assignee as the present application, and U.S. Pat. Nos. 4,905,243, 5,978,391, 5,450,207, 4,926,428, 5,748,346, 5,025,445, 6,160,832, 6,160,831 and 5,978,394, all of the above wavelength and/or bandwidth detection and monitoring components being hereby incorporated by reference. In accord with a preferred embodiment herein, the bandwidth is monitored and controlled in a feedback loop including the processor 116 and optics control module gas handling module 106. The total pressure of the gas mixture in the laser tube 102 is controlled to a particular value for producing an output beam at a particular bandwidth.

Other components of the diagnostic module may include a pulse shape detector or ASE detector, such as are described at U.S. Pat. No. 6,243,405 and U.S. patent application Ser. Nos. 09/842,281 and 09/418,052, respectively, each of which is assigned to the same assignee as the present application and is hereby incorporated by reference, such as for gas control and/or output beam energy stabilization, or to monitor the amount of amplified spontaneous emission (ASE) within the beam to ensure that the ASE remains below a predetermined level, as set forth in more detail below. There may be a beam alignment monitor, e.g., such as is described at U.S. Pat. No. 6,014,206, or beam profile monitor, e.g., U.S. patent application Ser. No. 09/780,124, which is assigned to the same assignee, wherein each of these patent documents is hereby incorporated by reference.

The processor or control computer 116 receives and processes values of some of the pulse shape, energy, ASE, energy stability, energy overshoot for burst mode operation, wavelength, spectral purity and/or bandwidth, among other input or output parameters of the laser system and output beam. The processor 116 also controls the line narrowing module to tune the wavelength and/or bandwidth or spectral purity, and controls the power supply and pulser module 104 and 108 to control preferably the moving average pulse power or energy, such that the energy dose at points on the workpiece is stabilized around a desired value. In addition, the computer 116 controls the gas handling module 106 which includes gas supply valves connected to various gas sources. Further functions of the processor 116 such as to provide overshoot control, energy stability control and/or to monitor input energy to the discharge, are described in more detail at U.S. patent application Ser. No. 09/588,561, which is assigned to the same assignee and is hereby incorporated by reference.

As shown in FIG. 1, the processor 116 preferably communicates with the solid-state or thyratron pulser module 104 and HV power supply 108, separately or in combination, the gas handling module 106, the optics modules 110 and/or 112, the diagnostic module 118, and an interface 124. The laser resonator which surrounds the laser chamber 102 containing the laser gas mixture includes optics module 110 including line-narrowing optics for a line narrowed excimer or molecular fluorine laser, which may be replaced by a high reflectivity mirror or the like in a laser system wherein either line-narrowing is not desired, or if line narrowing is performed at the front optics module 112, or an spectral filter external to the resonator is used for narrowing the linewidth of the output beam. Several variations of line-narrowing optics are set forth in detail below.

The laser gas mixture is initially filled into the laser chamber 102 in a process referred to herein as a "new fills". In such procedure, the laser tube is evacuated of laser gases and contaminants, and re-filled with an ideal gas composition of fresh gas. The gas composition for a very stable excimer or molecular fluorine laser in accord with the preferred embodiment uses helium or neon or a mixture of helium and neon as buffer gas(es), depending on the particular laser being used. Preferred gas compositions are described at U.S. Pat. Nos. 4,393,405, 6,157,162 and 4,977, 573 and U.S. patent application Ser. Nos. 09/513,025, 09/447,882, 09/418,052, and 09/588,561, each of which is assigned to the same assignee and is hereby incorporated by reference into the present application. The concentration of the fluorine in the gas mixture may range from 0.003% to 1.00%, and is preferably around 0.1%. An additional gas additive, such as a rare gas or otherwise, may be added for increased energy stability, overshoot control and/or as an attenuator as described in the Ser. No. 09/513,025 application incorporated by reference above. Specifically, for the F2-laser, an addition of xenon, krypton and/or argon may be used. The concentration of xenon or argon in the mixture may range from 0.0001% to 0.1%. For an ArF-laser, an addition of xenon or krypton may be used also having a concentration between 0.0001% to 0.1%. For the KrF laser, an addition of xenon or argon may be used also having a concentration between 0.0001% to 0.1%. Although the preferred embodiments herein are particularly drawn to use with a $F_2$ laser, some gas replenishment actions are described for gas mixture compositions of other systems such as ArF, KrF, and XeCl excimer lasers, wherein the ideas set forth herein may also be advantageously incorporated into those systems.

Halogen gas injections, including micro-halogen injections of, e.g., 1–3 milliliters of halogen gas, mixed with, e.g., 20–60- milliliters of buffer gas or a mixture of the halogen gas, the buffer gas and a active rare gas for rare gas-halide excimer lasers, per injection for a total gas volume in the laser tube 102 of, e.g., 100 liters, total pressure adjustments and gas replacement procedures may be performed using the gas handling module 106 preferably including a vacuum pump, a valve network and one or more gas compartments. The gas handling module 106 receives gas via gas lines connected to gas containers, tanks, canisters and/or bottles. Some preferred and alternative gas handling and/or replenishment procedures, other than as specifically described herein (see below), are described at U.S. Pat. Nos. 4,977, 573, 6,212,214 and 5,396,514 and U.S. patent application Ser. Nos. 09/447,882, 09/418,052, 09/734,459, 09/513,025 and 09/588,561, each of which is assigned to the same assignee as the present application, and U.S. Pat. Nos. 5,978,406, 6,014,398 and 6,028,880, all of which are hereby incorporated by reference. A xenon gas or other gas additive supply may be included either internal or external to the laser system according to the '025 application, mentioned above.

Total pressure adjustments in the form of releases of gases or reduction of the total pressure within the laser tube 102 may also be performed. Total pressure adjustments may be followed by gas composition adjustments if it is determined that, e.g., other than the desired partial pressure of halogen gas is within the laser tube 102 after the total pressure adjustment. Total pressure adjustments may also be performed after gas replenishment actions, and may be performed in combination with smaller adjustments of the driving voltage to the discharge than would be made if no pressure adjustments were performed in combination.

Gas replacement procedures may be performed and may be referred to as partial, mini- or macro-gas replacement operations, or partial new fill operations, depending on the amount of gas replaced, e.g., anywhere from a few milliliters up to 50 liters or more, but less than a new fill, such as are set forth in the Ser. No. 09/734,459 application, incorporated by reference above. As an example, the gas handling unit 106 connected to the laser tube 102 either directly or through an additional valve assembly, such as may include a small compartment for regulating the amount of gas injected (see the '459 application), may include a gas line for injecting a premix A including 1% $F_2$:99% Ne or other buffer gas such as He, and another gas line for injecting a premix B including 1% rare gas:99% buffer gas, for a rare gas-halide excimer laser, wherein for a $F_2$ laser premix B is not used. Another line may be used for total pressure additions or reductions, i.e., for flowing buffer gas into the laser tube or allowing some of the gas mixture in the tube to be released, possibly accompanying halogen injections for maintaining the halogen concentration. Thus, by injecting premix A (and premix B for rare gas-halide excimer lasers) into the tube 102 via the valve assembly, the fluorine concentration in the laser tube 102 may be replenished. Then, a certain amount of gas may be released corresponding to the amount that was injected to maintain the total pressure at a selected level. Additional gas lines and/or valves may be used for injecting additional gas mixtures. New fills, partial and mini gas replacements and gas injection procedures, e.g., enhanced and ordinary micro-halogen injections, such as between 1 milliliter or less and 3–10 milliliters, and any and all other gas replenishment actions are initiated and controlled by the processor 116 which controls valve assemblies of the gas handling unit 106 and the laser tube 102 based on various input information in a feedback loop. These gas replenishment procedures may be used in combination with gas circulation loops and/or window replacement procedures to achieve a laser system having an increased servicing interval for both the gas mixture and the laser tube windows.

A general description of the line-narrowing features of embodiments of the laser system particularly for use with photolithographic applications is provided here, followed by a listing of patent and patent applications being incorporated by reference as describing variations and features that may be used within the scope of the preferred embodiments herein for providing an output beam with a high spectral purity or bandwidth (e.g., below 1 pm and preferably 0.6 pm or less). These exemplary embodiments may be used for selecting the primary line $\lambda_1$ only, or may be used to provide additional line narrowing as well as performing line-selection, or the resonator may include optics for line-selection and additional optics for line-narrowing of the selected line, and line-narrowing may be provided by controlling (i.e., reducing) the total pressure (see U.S. patent application Ser. No. 60/212,301, which is assigned to the same assignee and is hereby incorporated by reference). A line-selection and line-narrowing molecular fluorine laser resonator according to a preferred embodiment herein is described in more detail below with reference to FIG. 3.

Exemplary line-narrowing optics contained in the optics module 110 include a beam expander, an optional interferometric device such as an etalon or a device having a pair of opposed non-planar reflection plates such as may be described in the Ser. Nos. 09/715,803 or 60/280,398 applications, which are assigned to the same assignee as the present application and are hereby incorporated by reference, and a diffraction grating, and alternatively one or more dispersion prisms may be used, wherein the grating would produce a relatively higher degree of dispersion than the prisms although generally exhibiting somewhat lower efficiency than the dispersion prism or prisms, for a narrow band laser such as is used with a refractive or catadioptric optical lithography imaging system. As mentioned above, the front optics module may include line-narrowing optics such as may be described in any of the Ser. Nos. 09/715,803, 09/738,849, and 09/718,809 applications, each being assigned to the same assignee and hereby incorporated by reference.

Instead of having a retro-reflective grating in the rear optics module 110, the grating may be replaced with a highly reflective mirror, and a lower degree of dispersion may be produced by a dispersive prism, or a beam expander and an interferometric device such as an etalon or device having non-planar opposed plates may be used for line-selection and narrowing, or alternatively no line-narrowing or line-selection may be performed in the rear optics module 110. In the case of using an all-reflective imaging system, the laser may be configured for semi-narrow band operation such as having an output beam linewidth in excess of 0.5 pm, depending on the characteristic broadband bandwidth of the laser, such that additional line-narrowing of the selected line would not be used, either provided by optics or by reducing the total pressure in the laser tube.

The beam expander of the above exemplary line-narrowing optics of the optics module 110 preferably includes one or more prisms. The beam expander may include other beam expanding optics such as a lens assembly or a converging/diverging lens pair. The grating or a highly reflective mirror is preferably rotatable so that the wavelengths reflected into the acceptance angle of the resonator can be selected or tuned. Alternatively, the grating, or other optic or optics, or the entire line-narrowing module may be pressure tuned, such as is set forth in the Ser. No. 09/771,366 application and the Ser. No. 6,154,470 patent, each of which is assigned to the same assignee and is hereby incorporated by reference. The grating may be used both for dispersing the beam for achieving narrow bandwidths and also preferably for retroreflecting the beam back toward the laser tube. Alternatively, a highly reflective mirror is positioned after the grating which receives a reflection from the grating and reflects the beam back toward the grating in a Littman configuration, or the grating may be a transmission grating. One or more dispersive prisms may also be used, and more than one etalon or other interferometric device may be used.

Depending on the type and extent of line-narrowing and/or selection and tuning that is desired, and the particular laser that the line-narrowing optics are to be installed into, there are many alternative optical configurations that may be used other than those specifically described below with respect to FIG. 3. For this purpose, those shown in U.S. Pat. Nos. 4,399,540, 4,905,243, 5,226,050, 5,559,816, 5,659,419, 5,663,973, 5,761,236, 6,081,542, 6,061,382, 6,154,470, 5,946,337, 5,095,492, 5,684,822, 5,835,520, 5,852,627, 5,856,991, 5,898,725, 5,901,163, 5,917,849, 5,970,082, 5,404,366, 4,975,919, 5,142,543, 5,596,596, 5,802,094, 4,856,018, 5,970,082, 5,978,409, 5,999,318, 5,150,370 and 4,829,536, and German patent DE 298 22 090.3, and any of the patent applications mentioned above and below herein, may be consulted to obtain a line-narrowing configuration that may be used with a preferred laser system herein, and each of these patent references is each hereby incorporated by reference into the present application.

Optics module 112 preferably includes means for outcoupling the beam 120, such as a partially reflective resonator reflector. The beam 120 may be otherwise outcoupled such as by an intra-resonator beam splitter or partially reflecting surface of another optical element, and the optics module 112 would in this case include a highly reflective mirror. The optics control module 114 preferably controls the optics modules 110 and 112 such as by receiving and interpreting signals from the processor 116, and initiating realignment, gas pressure adjustments in the modules 110, 112, or reconfiguration procedures (see the '353, '695, '277, '554, and '527 applications mentioned above).

The halogen concentration in the gas mixture is maintained constant during laser operation by gas replenishment actions by replenishing the amount of halogen in the laser tube for the preferred molecular fluorine laser herein, such that these gases are maintained in a same predetermined ratio as are in the laser tube 102 following a new fill procedure. In addition, gas injection actions such as $\mu$HIs as understood from the '882 application, mentioned above, may be advantageously modified into micro gas replacement procedures, such that the increase in energy of the output laser beam may be compensated by reducing the total pressure. In addition, the laser system is preferably configured for controlling the input driving voltage so that the energy of the output beam is at the predetermined desired energy. The driving voltage is preferably maintained within a small range around $HV_{opt}$, while the gas procedure operates to replenish the gases and maintain the average pulse energy or energy dose, such as by controlling an output rate of change of the gas mixture or a rate of gas flow through the laser tube 102. Advantageously, the gas procedures set forth herein permit the laser system to operate within a very small range around $HV_{opt}$, while still achieving average pulse energy control and gas replenishment, and increasing the gas mixture lifetime or time between new fills (see U.S. patent application Ser. No. 09/780,120, which is assigned to the same assignee as the present application and is hereby incorporated by reference).

In all of the above and below embodiments, the material used for any dispersive prisms, the prisms of any beam expanders, etalons or other interferometric devices, laser windows and the outcoupler is preferably one that is highly transparent at wavelengths below 200 nm, such as at the 157 nm output emission wavlength of the molecular fluorine laser. The materials are also capable of withstanding long-term exposure to ultraviolet light with minimal degradation effects. Examples of such materials are $CaF_2$, $MgF_2$, BaF2, LiF and $SrF_2$, and in some cases fluorine-doped quartz may be used. Also, in all of the embodiments, many optical surfaces, particularly those of the prisms, may or may not have an anti-reflective coating on one or more optical surfaces, in order to minimize reflection losses and prolong their lifetime.

Also, the gas composition for the $F_2$ laser in the above configurations uses either helium, neon, or a mixture of helium and neon as a buffer gas. The concentration of fluorine in the buffer gas preferably ranges from 0.003% to around 1.0%, and is preferably around 0.1%. However, if the total pressure is reduced for narrowing the bandwidth, then the fluorine concentration may be higher than 0.1%, such as may be maintained between 1 and 7 mbar, and more preferably around 3–5 mbar, notwithstanding the total pressure in the tube or the percentage concentration of the halogen in the gas mixture. The addition of a trace amount of xenon, and/or argon, and/or oxygen, and/or krypton and/or other gases (see the '025 application) may be used for increasing the energy stability, burst control, and/or output energy of the laser beam. The concentration of xenon, argon, oxygen, or krypton in the mixture may range from 0.0001% to 0.1%, and would be preferably significantly below 0.1%. Some alternative gas configurations including trace gas additives are set forth at U.S. patent application Ser. No. 09/513,025 and U.S. Pat. No. 6,157,662, each of which is assigned to the same assignee and is hereby incorporated by reference.

A line-narrowed oscillator, e.g., a set forth above, may be followed by a power amplifier for increasing the power of the beam output by the oscillator. Preferred features of the oscillator-amplifier set-up are set forth at U.S. patent application Ser. Nos. 09/599,130 and 60/228,184, which are assigned to the same assignee and are hereby incorporated by reference. The amplifier may be the same or a separate discharge chamber 102. An optical or electrical delay may be used to time the electrical discharge at the amplifier with the reaching of the optical pulse from the oscillator at the amplifier. With particular respect to the present invention, the molecular fluorine laser oscillator has an advantageous output coupler having a transmission interference maximum at $\lambda_1$ and a minimum at $\lambda_2$, and is described in more detail below. A 157 nm beam is output from the output coupler and is incident at the amplifier of this embodiment to increase the power of the beam. Thus, a very narrow bandwidth beam is achieved with high suppression of the secondary line $\lambda_2$ and high power (at least several Watts to more than 10 Watts).

Line-Narrowed $F_2$-Laser Oscillator

Figure 2:
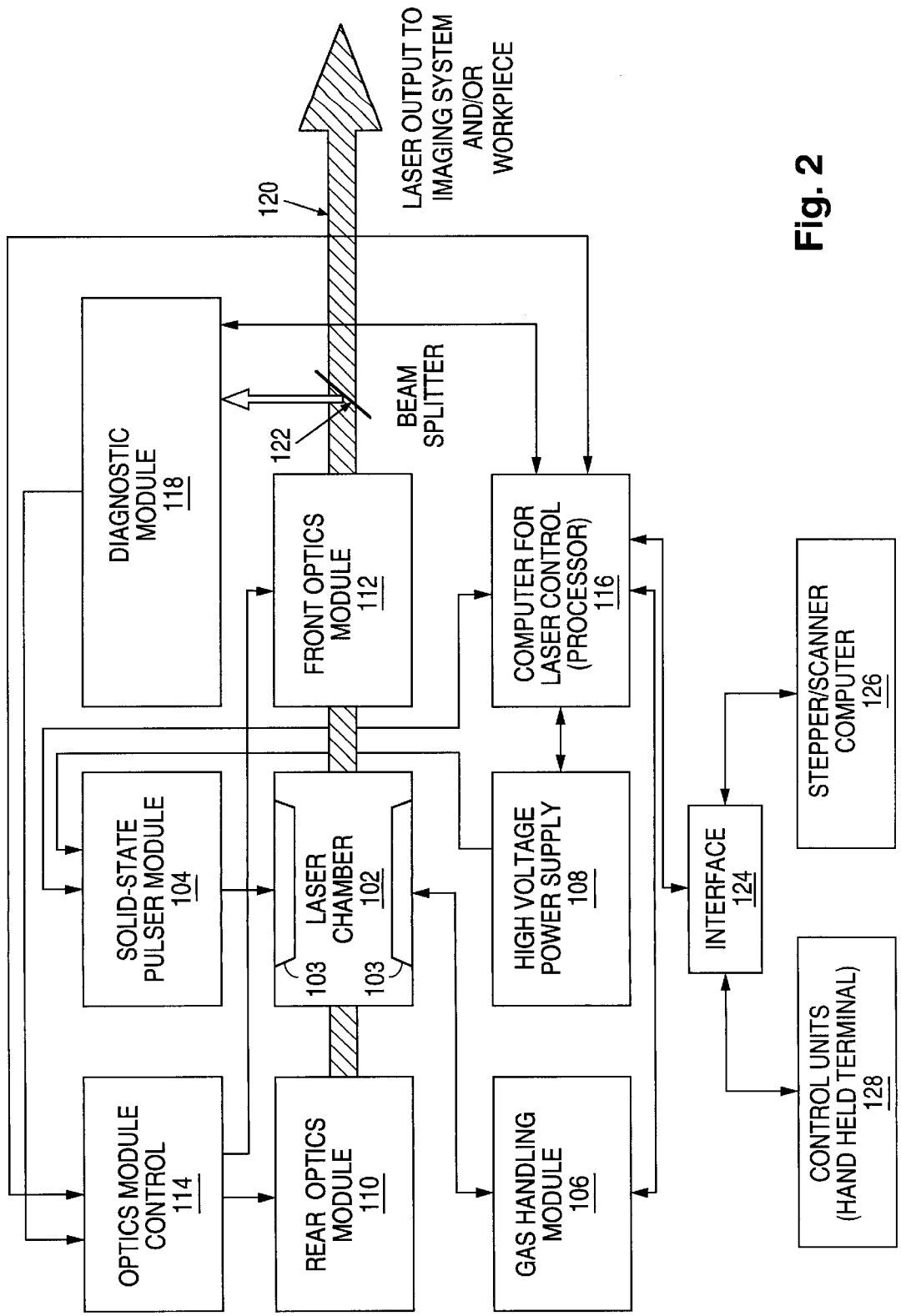
FIG. 2 schematically shows an $F_2$-laser system in accord with a preferred embodiment.
Figure 3:
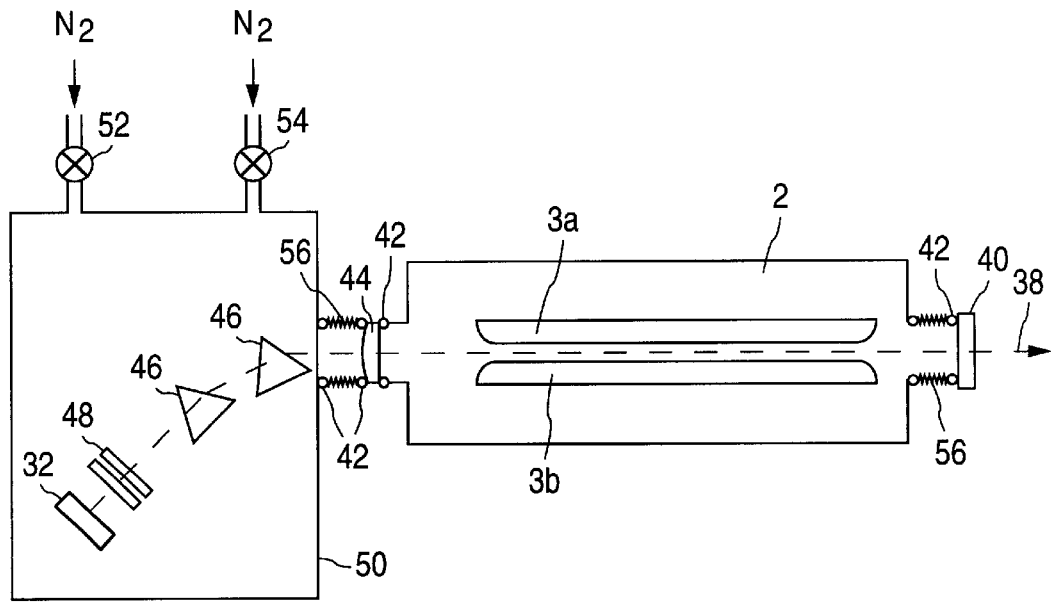
FIG. 3 schematically shows a line-narrowed $F_2$-laser resonator in accord with a preferred embodiment.

FIG. 3 schematically shows a preferred embodiment of a resonator arrangement for a molecular fluorine ($F_2$) laser including a line-narrowing module 50 having a prism beam expander 46 and an etalon 48 or interferometric device having non-planar parallel, opposed plates for line selection and/or line narrowing. The resonator arrangement of the seventh embodiment includes a discharge chamber 2 filled with a gas mixture including molecular fluorine and one or more buffer gases such as neon and/or helium. A pair of main discharge electrodes 3a, 3b are in the discharge chamber 2 and connected to a pulser circuit (not shown) for energizing the molecular fluorine. The discharge chamber 2 is preferably as the chamber 102 described above with reference to FIG. 2. One or more preionization units is also within the discharge chamber (not shown, but see the Ser. No. 09/692, 265 application, mentioned above). Other aspects of the discharge chamber 2 may be found at the Ser. No. 09/453, 670 application and otherwise as set forth above and/or as understood by those skilled in the art.

One window 40 of the configuration shown in FIG. 3 is a plano-parallel optical window which serves as an outcoupler. A partially reflective mirror may alternatively be used separate from the chamber window 40 for outcoupling the beam. The window 40 serving the dual role of sealing the chamber 2 and outcoupling the beam reduces the number of optical surfaces within the resonator and thereby may advantageously enhance its efficiency. The window 40 is preferably aligned perpendicular to the optical axis, but may be oriented at an angle such as 5° or at Brewster's angle or another selected angle for achieving desired reflectivity and transmissivity characteristics and/or to prevent parasitic oscillations.

Vacuum bellow 56 or similar arrangement provides versatility in degrees of freedom of adjustment and a vacuum-tight seal. The other window 44 is preferably a plano-convex lens serving to compensate the wavefront curvature as described in U.S. Pat. No. 6,061,382 and European Patent Application EP 00955706 A1, each of which is assigned to the same assignee and is hereby incorporated by reference. Tightness of the seal is provided by seals 42. The lens 44 may or may not be adjustable in orientation. The lens 44 may be tilted slightly off the normal to the beam (5 degrees or so) in order to suppress or avoid parasitic oscillations. Preferably, this lens 44 is anti-reflectively coated.

The resonator of the $F_2$-laser according to the preferred embodiment shown at FIG. 3 includes a line-selection and/or line-narrowing unit coupled with the chamber 2 via the bellows 56 and seals 42. The beam is preferably expanded by one or more beam expansion prisms 46 in order to reduce its divergency. Several prisms 46 may be used, and a converging diverging lens pair may be used or other beam expansion means known to those skilled in the art.

A transmissive etalon is preferably positioned after the beam expander prisms 46 and serves as a wavelength selector. Alternatively, an interferometric device having non-parallel opposed inner reflection plates, such as may be described in more detail at the Ser. Nos. 09/715,803 and 280,398 applications, may be used. Finally, highly reflecting mirror 32 returns the beam back through the resonator.

The line-narrowing unit is within an enclosure 50 that is coupled to the laser chamber 2 using a bellows 56 and seals 42 such that the line-narrowing unit of the laser resonator is sealed from the outer atmosphere. A inert purge gas is preferably flowed through the enclosure 50 via inert and outlet ports 52, 54. A vacuum port may be included or a pump can be connected via either port 52 or 54. the inert gas purge may be not used wherein the enclosure 50 may be maintained in a substantially evacuated state at low pressure. A method for controlling the atmosphere in the enclosure may be to maintain the enclosure under evacuated conditions using a pump, or to flow the purge gas rapidly through the enclosure 50, or preferably to first evacuate the enclosure and then to flow the purge gas at a low flow rate. An evacuation may be followed by a backfill of the purge gas and the procedure may be repeated a number of times, e.g., 1–10 times, before the purge gas is flowed at a low rate. For more details and alternative procedures for preparing and maintaining the atmosphere of the enclosure, see U.S. Pat. No. 6,219,368 and U.S. patent application Ser. Nos. 09/594, 892 and 09/598,522, each of which is assigned to the same assignee as the present application and is hereby incorporated by reference (relating to an enclosure for a beam delivery path and diagnostic beam splitter module for an $F_2$-laser).

The entire beam path between the chamber 2 and the highly reflective mirror 32 is in fact preferably enclosed within the enclosure 50 which is purged with some inert gas such as preferably nitrogen, or helium, argon, krypton or the like. High purity nitrogen is preferably used for this purpose.

The pressure of the nitrogen gas, or other inert gas, in the enclosure 50 may be adjustable, and by changing the pressure of gas, one can adjust the transmission spectrum of the interferometric device 48 (see, e.g., U.S. patent application Ser. No. 09/771,366, relating to pressure tuning a line-narrowing unit including a grating and beam expander, which is assigned to the same assignee and is hereby incorporated by reference). The interferometric device 48 may be enclosed in its own inert gas filled housing (not shown) wherein the pressure in this housing may be controlled for controlling the transmission spectrum of the interferometric device 48. The maximum of transmission of the interferometric device 48 is preferably adjusted to coincide with a maximum in the primary line at $\lambda_1$ around 157.62 nm, among multiple lines around 157 nm including also a secondary line around 157.52 nm which is preferably suppressed, of the natural emission spectrum of the free-running $F_2$ laser.

Figure 4A:
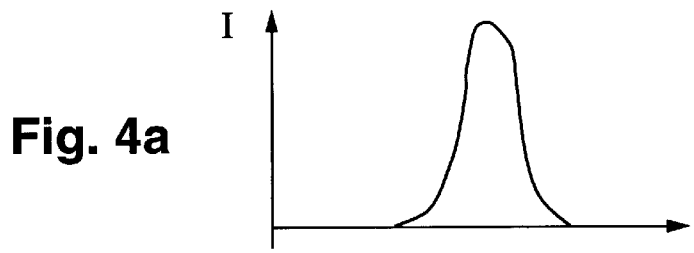
FIG. 4a illustrates a free-running spectrum of a selected emission line of a $F_2$-laser.
Figure 4B:
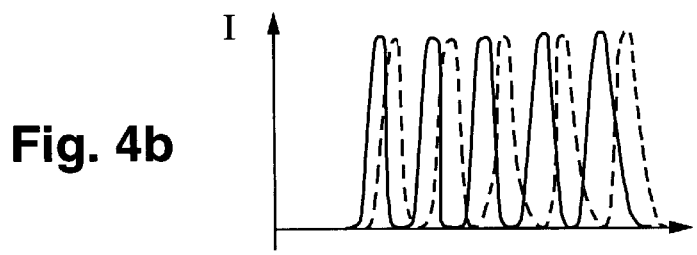
FIG. 4b illustrates a transmission spectra of an interferometric device such as an etalon at two tuning conditions of the interferometric device.
Figure 4C:
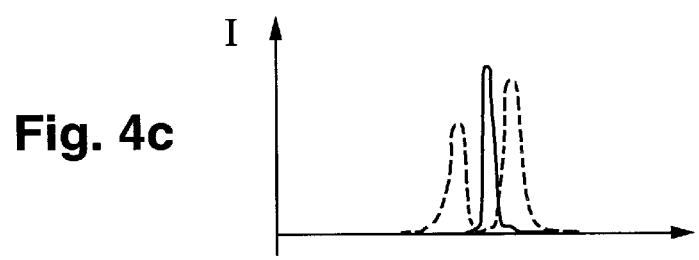
FIG. 4c illustrates output emission spectra of the $F_2$ laser which generates the free-running line of FIG. 4a and including an intracavity interferometric device having the transmission spectra shown in FIG. 4b.

This pressure tuning of the transmission spectrum of the interferometric device is illustrated at FIGS. 4a–4c. The interferometric device may be alternatively rotatably tuned or the gap spacing between the opposed inner plates may be configured to be adjustable. At FIG. 4b, the transmission spectrum of the interferometric device 48 is shown as a periodic function of the wavelength. Since the width of each transmission peak is roughly the free spectral range of the interferometric device 48 divided by its finesse, and finesse is limited by quality of optical surfaces, it is preferred to reduce the free spectral range as much as possible in order to minimize the width of transmission peak. The minimum free spectral range is determined by specifications that the peaks that are adjacent to the central peak do not produce oscillations. As the approximate natural bandwidth (see FIG. 4a) is 0.6 pm to 1.0 pm, the optimal free spectral range is about 1.0 pm. The solid lines of FIGS. 4a–4c illustrate the case of perfect spectral alignment of the interferometric device with the selected line shown at FIG. 4a, whereas dashed lines shown in FIGS. 4b–4c illustrate occurrence of a second peak in the laser output when the transmission spectrum is shifted from the optimum. The pressure dependence of the transmission spectrum of an etalon is described in the U.S. Pat. No. 6,154,470 patent. One way of varying the pressure is to control intake and escape rates of nitrogen using needle valves 52 and 54 shown in FIG. 3. Closing outlet valve 54 and/or opening inlet valve 52 causes pressure to rise, and vice-versa.

The variations of this embodiment can be the one with outcoupler 40 as a separate optical element, with the output window of the chamber being a plano—plano window. This provides an opportunity to mount resonator optics onto a mechanically stable structure, decoupled from the chamber. However, this can increase optical losses and reduce the efficiency of the laser.

The described laser oscillator may typically produce lower output power, as compared to the free-running resonator. Therefore, an amplifier (not shown, but see the Ser. No. 09/599,130 application) can be used in the embodiment.

The preferred material for all optical elements is $CaF_2$, however, $MgF_2$, $BaF_2$, $SrF_2$ or LiF can be also used. The interferometric device 48 has its internal surfaces preferably coated with thin film dielectric coatings having reflectivities of 90% to 97%, whereas the outside surfaces are preferably anti-reflectively coated.

Alternative Embodiments

Line narrowing is preferably provided by an interferometric device such as an etalon, and the interferometric device may serve as an outcoupler or highly reflective resonator reflector. The interferometric device may also be provided before a highly or partially reflective resonator reflector mirror, as shown in the preferred embodiment. The interferometric device may have a high or low finesse depending on the free spectral range desired and whether it is used as a resonator reflector in reflective mode or is used in transmissive mode as shown in the embodiment of FIG. 3.

An alternative embodiment may also be realized using one or more apertures with a dispersive element such as preferably a prism, and alternatively a grating. An aperture may be used for line selection when the prism is dispersing the emission of the $F_2$-laser. The selected line traverses the aperture, and the unselected line is blocked by the aperture. An interferometric device or prism may then be used for narrowing of the selected line.

The free spectral range (FSR) of the interferometric device is approximately equal to, but is somewhat less than, the linewidth of the selected line of the free running laser, such that the output linewidth of the selected line is narrowed. The FSR should not be much less than the free running linewidth, in order to prevent sidebands from developing in adjacent interference orders. If the FSR is too small then there will be significant overlap of the outer peaks of the transmission (or reflectivity) spectrum with the selected line. If "parasitic" sidebands are allowed to resonate, then beam quality may be deteriorated. When there is a dispersive element in the resonator, such as the prism 4 or another prism or prisms or a grating, the selected line may be narrowed further by reducing the width of the transmission (or reflectivity) maxima of the interferometric device, such that the sidebands are not suppressed, while apertures are placed within the resonator to chop off the sidebands, ultimately resulting in a narrow, high quality output beam.

The interferometric device 48 may be configured to both seal the discharge chamber 102 and as a window, in order to eliminate the lossy optical interfaces of an additional optical window sealing the chamber 102, and to reduce the overall size of the resonator setup. The interferometric device may seal the chamber 102 via a bellows and an o-ring, as shown in FIG. 4 of the Ser. No. 09/657,396 application, in an exemplary embodiment.

As mentioned, the interferometric device may be encased within a housing. A gas inlet may be preferably provided in this embodiment for allowing one or more of gases such as helium, neon, krypton, argon, nitrogen, another inert gas or another gas that does not strongly absorb around 157 nm, to fill the housing at a selected pressure. The housing may be equipped with means for measuring the pressure and/or temperature of the gas within it, wherein such pressure and/or temperature information may be relayed to the processor 116 for controlling the pressure and/or temperature. Also, the gas inlet may be used to pump the housing, including the gap between the plates of the interferometric device, to a low pressure using, e.g., a mechanical pump.

The reflecting interior surfaces of the plates of the interferometric device may be coated with a reflective film or may be left uncoated. Spacers of the interferometric device may comprise a low thermal expansion material such as invar™, zerodur, ultra low expansion (ULE™ glass) or quartz, or another material having a low constant of thermal expansion, such that the gap thickness between the opposed inner plates is least sensitive to temperature. This is advantageous because the transmission (or reflectivity) function of the interferometric device depends on the gap spacing.

The following illustrates how an estimate of the preferred gap thickness may be determined. Since the linewidth of the free running $F_2$-laser is about 1 pm or less and the wavelength is approximately 157 nm, the FSR may be approximately 0.4 cm$^{-1}$. This means that the etalon spacing would be 8.3 mm if the gap between the plates is filled with a solid material with a refractive index of around 1.5 (such as $MgF_2$, $CaF_2$, $LiF_2$, $BaF_2$, $SrF_2$, crystalline quartz or fluorine-doped quartz). The preferred interferometric device having its gap filled with an inert gas such as nitrogen or helium would have its thickness around approximately 12.5 mm. Both of these gap spacings are readily achievable.

As alluded to above, a design consideration of an intracavity interferometric device is the desire for stability of the transmission (or reflectivity) maxima and minima with respect to variations of ambient conditions, such as the temperature. For inert gases such as nitrogen, the refractive index changes by approximately 300 ppm per 1 bar of pressure. Therefore, with a spacing between reflecting surfaces being around 12.5 mm, frequency control within 10% of the FSR corresponds to pressure control within 2 mbars of resolution. As discussed, a reason to use helium in the pressure-tuned etalon 6, or alternatively nitrogen, argon or other inert gases or vacuum is because air is not transparent at the 157 nm wavelengths of interest, primarily due to the presence of oxygen, water vapor and carbon dioxide in the air, each of which strongly absorbs around 157 nm.

Additionally, the internal surfaces of the interferometric device may either be coated with partially reflective coatings, or may be uncoated. In the latter case, the reflectivity of each surface is approximately 4 to 6% which results in a maximum reflectivity of the etalon from 16% to 24%. Alternatively, a dielectric coating may be provided for high reflectivity such that each surface exhibits high reflectivity such as above 50% and perhaps as high as 90% or higher, e.g., up to 97%, as is preferred for the transmission interferometric device of FIG. 3. Similar considerations apply to the solid etalon, is used.

The interferometric device may be used for both line selection and simultaneously, for narrowing the selected single line, whether the interferometric device is used in transmission mode as in the preferred embodiment shown at FIG. 3, or in reflection mode as an output coupler or highly reflective resonator reflector. The line selection is achieved by adjusting the FSR and the wavelength of the maximum transmission (or reflectivity) of the interferometric device such a way that the transmission (or reflectivity) at the desired wavelength is maximized, and the transmission (or reflectivity) at the wavelength of other non-selected lines is at or substantially at its minimum.

The FSR of the interferometric device preferably used with the $F_2$-laser herein may be adjustable in the following manner. The pressure of the gas filling either the rear optics module 50 of FIG. 3 having the device therein, or a housing having only the device therein, and particularly the gas between the plates of the device, may be varied to adjust the index of refraction of the gas. Alternatively, the spacing between the plates may be varied, e.g., using piezo elements as spacers, or the device may be rotatable. By any of these methods, the FSR can be adjusted because the FSR depends on each of the index of refraction of the gas, the angle at which the beam is incident on the device and the spacing between the plates. If the interferometric device is used in reflection mode as a resonator reflector, the option of rotation tuning may not be possible. By adjusting the FSR of the devcie, line selection may be precisely performed by aligning a maximum in the transmission (or reflectivity) spectrum of the device with the desired line to be selected, and by contemporaneously aligning a minimum of the reflectivity spectrum of the device with any unselected lines of the free-running $F_2$-laser. An advantage of this configuration is simplicity, since no dispersive prism, grating, grism, birefringent plate, with or without an aperture, or other optic is used for line selection (note that the prisms 46 shown in FIG. 3 are preferably beam expansion prisms 46, although alternatively either or both of the prisms 46 may be dispersive for performing line-selection). However, the system may be less efficient at suppressing the unwanted lines, leading to residual emission at those wavelengths.

In addition to molecular fluorine, the gas mixture within the discharge chamber of the $F_2$-laser of the preferred embodiment further includes one or more other gases including at least one buffer gas. the buffer gas may be preferably helium, neon or a mixture of helium and neon. For example, the discharge chamber 102 may be initially filled with 60 mbar of 5% $F_2$ in Ne and balance He (e.g., 2440 mbar He), or 3–5 mbar $F_2$, and a mixture of Ne and He for pressurizing the chamber 102 to 1–5 bar.

In any embodiment of the $F_2$-laser herein, the longer the pulse duration, the narrower the spectral linewidth which is typically achievable. On each roundtrip of the laser beam inside the resonator, there occurs a spectral filtering of the beam. After each transmission through (or reflection from) the interferometric device 48, e.g., of the preferred embodiment of FIG. 3, the intensity spectrum of beam is the product of transmission (or reflection) function of the device and the incident spectrum. The spectral width of the beam will decrease approximately as an inverse square root of the number of roundtrips. In one embodiment, the length of the pulse of the molecular fluorine laser may be increased by utilizing more neon as a buffer gas. The pulse may be lengthened by lengthening the electrical pulse applied to the electrodes 3, as well.

The gas mixture is preferably optimized with respect to pulse energy (gain) and pulse energy stability. Higher pressure and higher fluorine concentration each typically achieve a higher energy result, but may also produce a higher pulse energy fluctuation. The preferred arrangement thus balances these considerations. A total pressure of approximately 3–5 bar and a fluorine concentration in the range 0.05% to 0.2% is preferred.

As noted above, one or more apertures may be inserted into the resonator of any of the embodiments herein. The apertures serve to chop off sidebands of the dispersion spectrum of any dispersive element and/or of the superposition of the interferometric device 48 transmission (or reflectivity) maximum with the selected emission line of the $F_2$-laser.

Line-Narrowed $F_2$-Laser Emission

FIGS. 4a–4c illustrate how an interferometric device such as an etalon or a device having non-parallel inner reflecting surfaces may be adjusted to narrow a selected line, e.g., the primary line around 157.62 nm, of the $F_2$-laser of the embodiments of FIGS. 2–3. FIG. 4a illustrates the natural emission spectrum of the primary line around 157.62 nm of the $F_2$ laser. The transmission (or reflectivity) of the interferometric device is a periodic function of the wavelength as illustrated at FIG. 4b. The solid line in FIG. 4b represents a first tuning configuration of the device and the dashed line represents a second tuning configuration of the device. The interferometric device may be tuned piezo-electrically or otherwise to adjust the geometric gap spacing, rotationally to adjust the incidence angle of the beam on the reflecting surfaces of the device and/or by adjusting the pressure or other parameter within the gap between its plates to adjust the index of refraction of the gas between the plates. One way of varying the pressure is to control intake and escape rates of the nitrogen purge gas shown at FIG. 3 using needle valves 52 and 54. Closing output valve 54 and/or opening inlet valve 52, e.g., causes the pressure to rise, and visa versa. As mentioned above, the interferometric device 48 of FIG. 3 may reside in its own housing that is separately pressure controlled from the pressure in the module 50 outside of the device housing.

Since the width of each transmission peak is roughly around the free spectral range of the interferometric device divided by its finesse, and the finesse is limited by the quality of optical surfaces, it is preferred to reduce the free spectrum range as much as possible in order to minimize the width of the transmission peak. The minimum free spectral range is determined by the specification the peaks that are adjacent to the central peak, substantially do not produce oscillations. As the approximate natural bandwidth of the emission peak illustrated at FIG. 4a may be roughly 0.5 pm to 1.0 pm, the preferred, optimal free spectral range is somewhere on the order of 1.0 pm. The solid lines shown at FIG. 4b and FIG. 4c illustrate a preferred spectral alignment, wherein FIG. 4c shows a single narrowed peak. The dashed lines of FIG. 4b and FIG. 4c illustrate an undesirable spectral alignment because two peaks are shown by dashed lines in FIG. 4c including the occurrence of a second peak in the laser output when the transmission spectrum of the interferometric device is shifted from the optimum shown by the solid line in FIGS. 4b–4c.

In an embodiment herein, and referring to FIG. 3, the interferometric device 48 may be an etalon or the device 48 may include non-parallel inner reflecting plates. The interferometric device 48 may be alternatively arranged such as on the other side, or outcoupling side of the chamber 2 and configured in transmission mode as the device 48 shown in FIG. 3 is configured. Alternatively, the device 48 may be configured in reflective mode and disposed as a highly reflective or partially reflective (i.e., outcoupling) resonator reflector.

When the device 48 is configured with non-parallel plates, the plates preferably have a gap spacing that changes along the geometric extent of the plates according to the disclosure in the Ser. No. 09/715,803 application. The beam incident on the interferometric device is made to be geometrically arranged or arranged along a cross-section of the beam profile according to wavelengths in the beam due to the passing of the beam through a dispersive element or elements such as the prisms 46 of FIG. 3.

The gas spacing at a center point of the plates of the device 48 is such as to provide constructive interference of a selected wavelength. Then, at a geometrical location away from the center at a wavelength that would represent a sideband if an ordinary etalon were used, the gap spacing is such as to provide destructive interference at that wavelength and the sidebands are thereby suppressed.

According to this embodiment, the FSR of the device 48 may be made such as to narrow the selected peak, wherein if an ordinary etalon were used, sidebands would be transmitted (or reflected). Advantageously, a narrower peak is transmitted (or reflected) by the device 48 without sidebands than an ordinary etalon would be capable of transmitting (or reflecting). As discussed above, it is advantageous to have a molecular fluorine laser which emits a narrower bandwidth beam.

Wavelength and Bandwidth Monitor

As understood from the above discussion, careful control of the center wavelength selected by the interferometric device 48 of FIG. 3 while suppressing sidebands is desired. The wavelength/bandwidth monitor shown in FIG. 5 may be advantageously used to monitor the spectral distribution of the beam emitted by the molecular fluorine laser, which includes a selected and narrowed spectral line. In this way, the transmission (or reflectivity) spectrum of the interferometric device 48 can be controlled based on information obtained by the wavelength monitor of FIG. 5 to be as the solid line spectrum of FIG. 4c and not as the dashed line spectrum of FIG. 4c.

Figure 5:
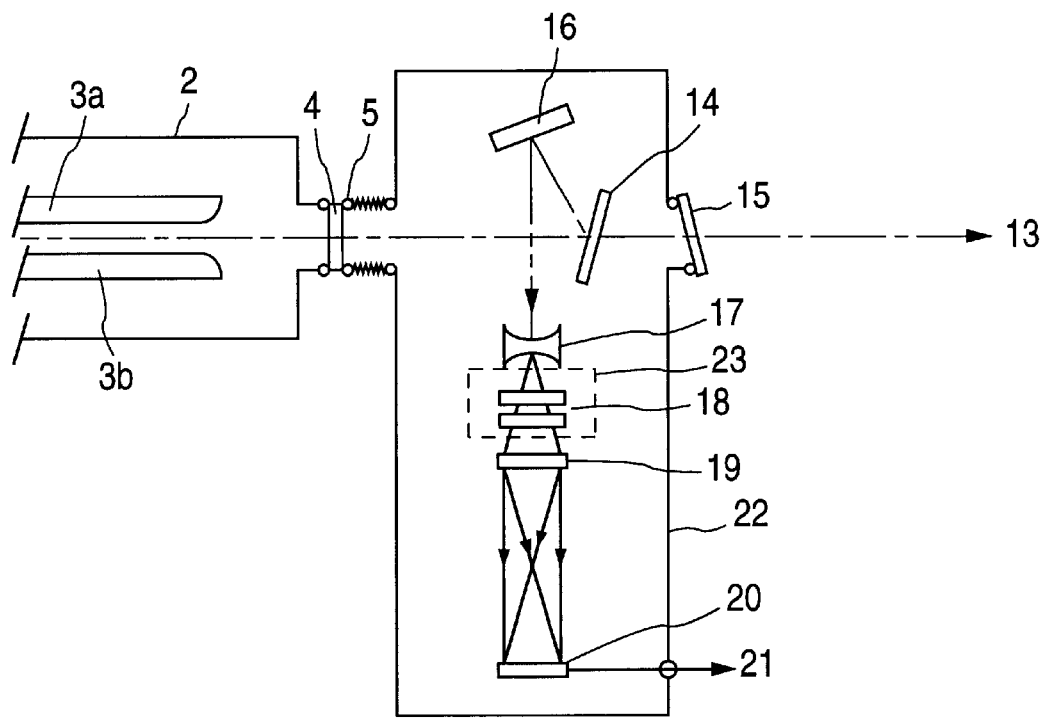
FIG. 5 schematically illustrates a wavelength monitor of a $F_2$ laser system according to a preferred embodiment.

FIG. 5 schematically illustrates a preferred design of a wavelength monitor for use with a molecular fluorine laser system, and particular one having an intracavity interferometric device such as the device 48 of FIG. 3. A small portion of the output laser beam 13 outcoupled at the outcoupler 4 of the resonator including the discharge chamber 2 having the electrodes 3 as described above is split off by the beam splitter 14 and directed by the mirror 16 into the spectrometric device 18, which is preferably a monitor etalon. The wavelength monitor is preferably enclosed within an enclosure 22 that seals the beam path from the resonator, wherein a bellows 5 is used, so that photoabsorbing species are prevented from accessing the beam path by purging the atmosphere in the enclosure 22 or evacuating the enclosure 22.

The split off portion of the beam is preferably expanded by a negative lens 17 before it enters the monitor etalon 18. Alternatively, an optical diffuser plate can be used in place of the negative lens, although, the intensity of light on the detector 20 may be significantly reduced in that case. A beam expander may be alternatively used, as well, and in another embodiment, the beam is directly incident on the monitor etalon 18 without expansion. A positive lens 19 is disposed after the etalon 18 to form an interference pattern on a linear diode array 20, which is positioned in the focal plane of the lens 19. An output 21 of the detector 20 is directed to a data acquisition device which may be the processor 116 of FIG. 2, and as described in more detail below with referernce to FIG. 6.

The entire wavelength monitor is preferably enclosed into the box 22 purged with an inert gas, such as high purity nitrogen or another inert gas that does not absorb at 157 nm, or evacuated. it is desired to avoid instabilities of the free range of the monitor etalon 18 due to variations in the pressure of purge gas. The monitor etalon 18 may be placed into a small enclosure 23 which is preferably evacuated or alternatively filled with an inert gas having a precisely controlled pressure. Such enclosure 23 should have optical windows (not shown). In another embodiment, the entire box 22 is evacuated.

Information of the spectral bandwidth and central wavelength is extracted from the observed interference pattern on the detector 20 preferably in a standard way as understood from U.S. Pat. No. 4,905,243 or as otherwise understood by those skilled in the art. For example, methods understood by those skilled in monitoring wavelengths of KrF or ArF lasers may be used.

Closed Loop Control of Wavelength and/or Bandwidth

Figure 6:
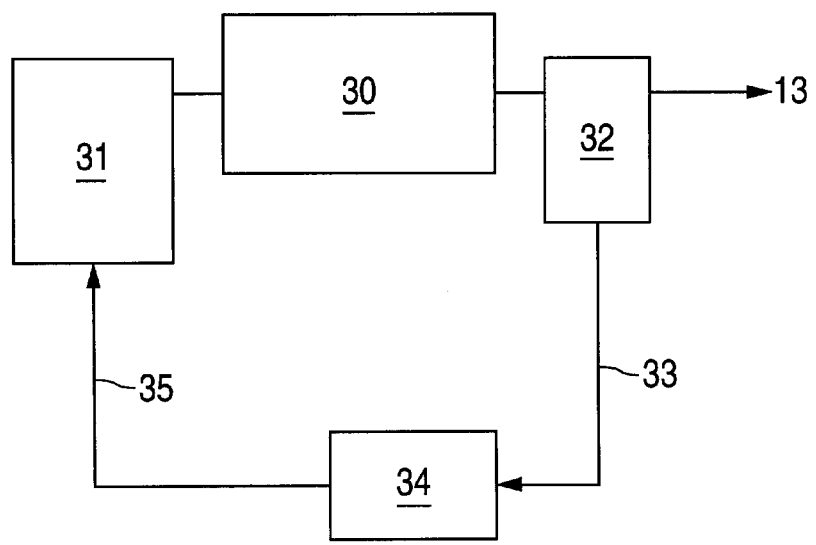
FIG. 6 illustrates closed loop wavelength control of a $F_2$ laser system according to a preferred embodiment.

A closed cycle control loop is schematically illustrated in FIG. 6. The output spectrum of a laser 30 is detected by the wavelength monitor 32. Data 33 are input to a central processing unit 34. This unit 34 determines the central wavelength and whether "side-peaks" are present. Based on these criteria, the pressure of the purging gas in the line-narrowing module 31 is adjusted up or down, through the control signal 35. The interferometric device 48 may be alternatively tuned as described above. This control loop functions to maintain a specified output emission wavelength of the beam 13 and to minimize an energy content of any side-bands.

While exemplary drawings and specific embodiments of the present invention have been described and illustrated, it is to be understood that that the scope of the present invention is not to be limited to the particular embodiments discussed. Thus, the embodiments shall be regarded as illustrative rather than restrictive, and it should be understood that variations may be made in those embodiments by workers skilled in the arts without departing from the scope of the present invention as set forth in the claims that follow, and equivalents thereof.

In addition, in the method claims that follow, steps are provided in a selected order for typographical convenience only and not to imply any particular order for performing the steps. Thus, the steps may be performed in a variety of orders within the scope of those claims, unless a particular order is otherwise expressly indicated or understood by those skilled in the art as being necessary. For example, in some method claims that follow, steps of selecting one of plural lines and narrowing the selected line may be performed in either or a combination of temporal orders as the beam traverses line-narrowing and/or selection elements and is outcoupled from the laser resonator.

What is claimed is:

1. A $F_2$-laser, comprising:
   a discharge chamber filled with a gas mixture including molecular fluorine for generating a spectral emission including a plurality of closely spaced lines in a wavelength range between 157 nm and 158 nm including a primary line and a secondary line;
   a plurality of electrodes coupled with a power supply circuit for producing a pulsed discharge to energize said molecular fluorine; and
   a resonator including the discharge chamber, a transmissive interferometric device and a pair of resonator reflectors for generating a laser beam having a bandwidth of less than 1 pm, said interferometric device being configured for maximum transmissivity of a selected portion of said primary line and for relatively low transmissivity of said secondary line and an unselected portion of said primary line to substantially suppress said secondary line and said unselected portion of said primary line, thereby selecting and narrowing said primary line such that said $F_2$-laser emits a single wavelength laser beam having a narrow spectral bandwidth that is less than the bandwidth of the primary line of a free-running $F_2$-laser to provide a narrow band VUV laser beam.

2. The laser of claim 1, wherein said resonator further comprises a beam expander before said transmissive interferometric device for expanding and reducing a divergence of said beam prior to impinging upon said interferometric device.

3. The laser of claim 2, wherein said transmissive interferometric device and said beam expander are disposed within a rear optics module of said resonator on an opposite side of said discharge chamber as said beam is output coupled from said resonator.

4. The laser of claim 3, wherein an atmosphere within said rear optics module is maintained substantially free of species that photoabsorb around 157 nm, and a beam path between said rear optic module and said discharge chamber is sealed from ambient air to maintain said beam path substantially free of said species that photoabsorb around 157 nm.

5. The laser of claim 1, wherein said transmissive interferometric device is disposed within a rear optics module of said resonator on an opposite side of said discharge chamber as said beam is output coupled from said resonator.

6. The laser of claim 5, wherein an atmosphere within said rear optics module is maintained substantially free of species that photoabsorb around 157 nm, and a beam path between said rear optic module and said discharge chamber is sealed from ambient air to maintain said beam path substantially free of said species that photoabsorb around 157 nm.

7. The laser of claim 6, wherein said rear optics module is purged with an inert gas having a pressure that is controlled for controlling an index of refraction of said gas for controlling an interferometric spectrum of said interferometric device.

8. The laser of claim 1, further comprising an amplifier for boosting an energy of said laser beam.

9. The laser of claim 1, wherein one of said pair of resonator reflectors also seals said discharge chamber.

10. The laser of claim 1, wherein a lens seals said discharge chamber as a window on said discharge chamber that transmits light emanating from said discharge chamber and propagating along an optical beam path toward said interferometric device.

11. The laser of claim 1, wherein said interferometric device comprises an etalon.

12. The laser of claim 1, wherein said interferometric device comprises a pair of opposing reflecting surfaces, and wherein at least a first of said pair of opposing reflecting surfaces is configured such that said first and second opposing reflecting surfaces have a varying optical distance therebetween over an incident beam cross-section which serves to suppress outer portions of said primary line to reduce spectral purity.

13. A $F_2$-laser, comprising:
   a discharge chamber filled with a gas mixture including molecular fluorine for generating a spectral emission including a plurality of closely spaced lines in a wavelength range between 157 nm and 158 nm including a primary line and a secondary line;
   a plurality of electrodes coupled with a power supply circuit for producing a pulsed discharge to energize said molecular fluorine; and
   a resonator including the discharge chamber, a reflective interferometric device, and another resonator reflector for generating a laser beam having a bandwidth of less than 1 pm, said interferometric device being configured for maximum reflectivity of a selected portion of said primary line and for relatively low reflectivity of said secondary line and an unselected portion of said primary line to substantially suppress said secondary line and said unselected portion of said primary line, thereby selecting and narrowing said primary line such that said $F_2$-laser emits a single wavelength laser beam having a narrow spectral bandwidth that is less than the bandwidth of the primary line of a free-running $F_2$-laser to provide a narrow band VUV laser beam.

14. The laser of claim 13, wherein said reflective interferometric device is highly reflective and serves as a highly reflective resonator reflector of said resonator.

15. The laser of claim 13, wherein said reflective interferometric device is partially reflective and serves as an output coupler of said resonator.

16. The laser of claim 13, wherein said interferometric device comprises an etalon.

17. The laser of claim 13, wherein said interferometric device comprises a pair of opposing reflecting surfaces, and wherein at least a first of said pair of opposing reflecting surfaces is configured such that said first and second opposing reflecting surfaces have a varying optical distance therebetween over an incident beam cross-section which serves to suppress outer portions of said primary line to reduce spectral purity.

18. The laser of claim 13, wherein said interferometric device is disposed within an optics module that is purged with an inert gas having a pressure that is controlled for controlling an index of refraction of said gas for controlling an interferometric spectrum of said interferometric device.

19. The laser of claim 13, further comprising an amplifier for boosting an energy of said laser beam.

20. A $F_2$-laser, comprising:
   a discharge chamber filled with a gas mixture including molecular fluorine for generating a spectral emission including a plurality of closely spaced lines in a wavelength range between 157 nm and 158 nm including a primary line and a secondary line;
   a plurality of electrodes coupled with a power supply circuit for producing a pulsed discharge to energize said molecular fluorine; and
   a resonator including the discharge chamber, a transmissive interferometric device, and a pair of resonator reflectors for generating a laser beam having a bandwidth of less than 1 pm, said interferometric device being configured for maximum transmissivity of said primary line and for relatively low transmissivity of said secondary line to substantially suppress said secondary line, thereby selecting said primary line such that said $F_2$-laser emits a single wavelength laser beam having a narrow spectral bandwidth that is less than the bandwidth of a free-running $F_2$-laser to provide a narrow band VUV laser beam.

21. The laser of claim 20, wherein said resonator further comprises a beam expander before said transmissive interferometric device for expanding and reducing a divergence of said beam prior to impinging upon said interferometric device.

22. The laser of claim 21, wherein said transmissive interferometric device and said beam expander are disposed within a rear optics module of said resonator on an opposite side of said discharge chamber as said beam is output coupled from said resonator.

23. The laser of claim 22, wherein an atmosphere within said rear optics module is maintained substantially free of species that photoabsorb around 157 nm, and a beam path between said rear optic module and said discharge chamber is sealed from ambient air to maintain said beam path substantially free of said species that photoabsorb around 157 nm.

24. The laser of claim 20, wherein said transmissive interferometric device is disposed within a rear optics module of said resonator on an opposite side of said discharge chamber as said beam is output coupled from said resonator.

25. The laser of claim 24, wherein an atmosphere within said rear optics module is maintained substantially free of species that photoabsorb around 157 nm, and a beam path between said rear optic module and said discharge chamber is sealed from ambient air to maintain said beam path substantially free of said species that photoabsorb around 157 nm.

26. The laser of claim 25, wherein said rear optics module is purged with an inert gas having a pressure that is controlled for controlling an index of refraction of said gas for controlling an interferometric spectrum of said interferometric device.

27. The laser of claim 20, further comprising an amplifier for boosting an energy of said laser beam.

28. The laser of claim 20, wherein one of said pair of resonator reflectors also seals said discharge chamber.

29. The laser of claim 20, wherein a lens seals said discharge chamber as a window on said discharge chamber that transmits light emanating from said discharge chamber and propagating along an optical beam path toward said interferometric device.

30. The laser of claim 20, wherein said gas mixture is maintained at a pressure below substantially 2 bar such that said spectral bandwidth is narrower than if said gas mixture were maintained at a pressure greater than 2 bar.

31. The laser of claim 20, wherein said gas mixture is maintained at a pressure below substantially 1.5 bar such that said spectral bandwidth is narrower than if said gas mixture were maintained at a pressure greater than 1.5 bar.

32. The laser of claim 20, wherein said gas mixture is maintained at a pressure below substantially 1 bar such that said spectral bandwidth is narrower than if said gas mixture were maintained at a pressure greater than 1 bar.

33. The laser of claim 20, wherein said interferometric device comprises an etalon.

34. The laser of claim 20, wherein said interferometric device comprises a pair of opposing reflecting surfaces, and wherein at least a first of said pair of opposing reflecting surfaces is configured such that said first and second opposing reflecting surfaces have a varying optical distance therebetween over an incident beam cross-section which serves to suppress outer portions of said primary line to reduce spectral purity.

35. A $F_2$-laser, comprising:
   a discharge chamber filled with a gas mixture including molecular fluorine for generating a spectral emission including a plurality of closely spaced lines in a wavelength range between 157 nm and 158 nm including a primary line and a secondary line;
   a plurality of electrodes coupled with a power supply circuit for producing a pulsed discharge to energize said molecular fluorine; and
   a resonator including the discharge chamber, a reflective interferometric device, and another resonator reflector for generating a laser beam having a bandwidth of less than 1 pm, said interferometric device being configured for maximum reflectivity of said primary line and for relatively low reflectivity of said secondary line to substantially suppress said secondary line, thereby selecting said primary line such that said $F_2$-laser emits a single wavelength laser beam having a narrow spectral bandwidth that is less than the bandwidth of a free-running $F_2$-laser to provide a narrow band VUV laser beam.

36. The laser of claim 35, wherein said reflective interferometric device is highly reflective and serves as a highly reflective resonator reflector of said resonator.

37. The laser of claim 35, wherein said reflective interferometric device is partially reflective and serves as an output coupler of said resonator.

38. The laser of claim 35, wherein said gas mixture is maintained at a pressure below substantially 2 bar such that said spectral bandwidth is narrower than if said gas mixture were maintained at a pressure greater than 2 bar.

39. The laser of claim 35, wherein said gas mixture is maintained at a pressure below substantially 1.5 bar such that said spectral bandwidth is narrower than if said gas mixture were maintained at a pressure greater than 1.5 bar.

40. The laser of claim 35, wherein said gas mixture is maintained at a pressure below substantially 1 bar such that said spectral bandwidth is narrower than if said gas mixture were maintained at a pressure greater than 1 bar.

41. The laser of claim 35, wherein said interferometric device comprises an etalon.

42. The laser of claim 35, wherein said interferometric device comprises a pair of opposing reflecting surfaces, and wherein at least a first of said pair of opposing reflecting surfaces is configured such that said first and second opposing reflecting surfaces have a varying optical distance therebetween over an incident beam cross-section which serves to suppress outer portions of said primary line to reduce spectral purity.

43. The laser of claim 35, wherein said interferometric device is disposed within an optics module that is purged with an inert gas having a pressure that is controlled for controlling an index of refraction of said gas for controlling an interferometric spectrum of said interferometric device.

44. The laser of claim 35, further comprising an amplifier for boosting an energy of said laser beam.

45. A $F_2$-laser, comprising:
a discharge chamber filled with a gas mixture including molecular fluorine for generating a spectral emission including a plurality of closely spaced lines in a wavelength range between 157 nm and 158 nm including a primary line and a secondary line;
a plurality of electrodes coupled with a power supply circuit for producing a pulsed discharge to energize said molecular fluorine; and
a resonator including the discharge chamber, a transmissive interferometric device, a dispersive optic and a pair of resonator reflectors for generating a laser beam having a bandwidth of less than 1 pm, said dispersive optic being arranged at a particular orientation for dispersing the plurality of closely-spaced lines including the primary and secondary lines such that only the primary line remains within an acceptance angle of the resonator and any other line(s) including the secondary line are dispersed outside of the acceptance angle of the resonator, said interferometric device being configured for maximum transmissivity of a selected portion of said primary line and for relatively low transmissivity of an unselected portion of said primary line to substantially suppress said unselected portion of said primary line, said dispersive optic and interferometric device thereby selecting and narrowing said primary line such that said $F_2$-laser emits a single wavelength laser beam having a narrow spectral bandwidth that is less than the bandwidth of the primary line of a free-running $F_2$-laser to provide a narrow band VUV laser beam.

46. The laser of claim 45, wherein said resonator further comprises a beam expander before said transmissive interferometric device for expanding and reducing a divergence of said beam prior to impinging upon said interferometric device.

47. The laser of claim 46, wherein said transmissive interferometric device and said beam expander are disposed within a rear optics module of said resonator on an opposite side of said discharge chamber as said beam is output coupled from said resonator.

48. The laser of claim 47, wherein an atmosphere within said rear optics module is maintained substantially free of species that photoabsorb around 157 nm, and a beam path between said rear optic module and said discharge chamber is sealed from ambient air to maintain said beam path substantially free of said species that photoabsorb around 157 nm.

49. The laser of claim 45, wherein said transmissive interferometric device is disposed within a rear optics module of said resonator on an opposite side of said discharge chamber as said beam is output coupled from said resonator.

50. The laser of claim 49, wherein an atmosphere within said rear optics module is maintained substantially free of species that photoabsorb around 157 nm, and a beam path between said rear optic module and said discharge chamber is sealed from ambient air to maintain said beam path substantially free of said species that photoabsorb around 157 nm.

51. The laser of claim 50, wherein said rear optics module is purged with an inert gas having a pressure that is controlled for controlling an index of refraction of said gas for controlling an interferometric spectrum of said interferometric device.

52. The laser of claim 45, further comprising an amplifier for boosting an energy of said laser beam.

53. The laser of claim 45, wherein one of said pair of resonator reflectors also seals said discharge chamber.

54. The laser of claim 45, wherein a lens seals said discharge chamber as a window on said discharge chamber that transmits light emanating from said discharge chamber and propagating along an optical beam path toward said interferometric device.

55. The laser of claim 45, wherein said interferometric device comprises an etalon.

56. The laser of claim 45, wherein said interferometric device comprises a pair of opposing reflecting surfaces, and wherein at least a first of said pair of opposing reflecting surfaces is configured such that said first and second opposing reflecting surfaces have a varying optical distance therebetween over an incident beam cross-section which serves to suppress outer portions of said primary line to reduce spectral purity.

57. A $F_2$-laser, comprising:
a discharge chamber filled with a gas mixture including molecular fluorine for generating a spectral emission including a plurality of closely spaced lines in a wavelength range between 157 nm and 158 nm including a primary line and a secondary line;
a plurality of electrodes coupled with a power supply circuit for producing a pulsed discharge to energize said molecular fluorine; and
a resonator including the discharge chamber, a reflective interferometric device, a dispersive optic and another resonator reflector for generating a laser beam having a bandwidth of less than 1 pm, said dispersive optic being arranged at a particular orientation for dispersing the plurality of closely-spaced lines including the primary and secondary lines such that only the primary line remains within an acceptance angle of the resonator and any other line(s) including the secondary line are dispersed outside of the acceptance angle of the resonator, said interferometric device being configured for maximum reflectivity of a selected portion of said primary line and for relatively low reflectivity of an unselected portion of said primary line to substantially suppress said unselected portion of said primary line, said dispersive optic and interferometric device thereby selecting and narrowing said primary line such that said $F_2$-laser emits a single wavelength laser beam having a narrow spectral bandwidth that is less than the bandwidth of the primary line of a free-running $F_2$-laser to provide a narrow band VUV laser beam.

58. The laser of claim 57, wherein said reflective interferometric device is highly reflective and serves as a highly reflective resonator reflector of said resonator.

59. The laser of claim 57, wherein said reflective interferometric device is partially reflective and serves as an output coupler of said resonator.

60. The laser of claim 57, wherein said interferometric device comprises an etalon.

61. The laser of claim 57, wherein said interferometric device comprises a pair of opposing reflecting surfaces, and wherein at least a first of said pair of opposing reflecting surfaces is configured such that said first and second opposing reflecting surfaces have a varying optical distance therebetween over an incident beam cross-section which serves to suppress outer portions of said primary line to reduce spectral purity.

62. The laser of claim 57, wherein said interferometric device is disposed within an optics module that is purged with an inert gas having a pressure that is controlled for controlling an index of refraction of said gas for controlling an interferometric spectrum of said interferometric device.

63. The laser of claim 57, further comprising an amplifier for boosting an energy of said laser beam.

64. A $F_2$-laser, comprising:
- a discharge chamber filled with a gas mixture including molecular fluorine for generating a spectral emission including a plurality of closely spaced lines in a wavelength range between 157 nm and 158 nm including a primary line and a secondary line;
- a plurality of electrodes coupled with a power supply circuit for producing a pulsed discharge to energize said molecular fluorine; and
- a resonator including the discharge chamber and an interferometric device for generating a laser beam having a bandwidth of less than 1 pm, said interferometric device being configured for relatively suppressing said secondary line and an unselected portion of said primary line to substantially suppress said secondary line and said unselected portion of said primary line compared with a selected portion of said primary line, thereby selecting and narrowing said primary line such that said $F_2$-laser emits a single wavelength laser beam having a narrow spectral bandwidth that is less than the bandwidth of the primary line of a free-running $F_2$-laser to provide a narrow band VUV laser beam.

65. The laser of claim 64, wherein said resonator further comprises a beam expander before said interferometric device for expanding and reducing a divergence of said beam prior to impinging upon said interferometric device.

66. The laser of claim 64, wherein said interferometric device is disposed within an optics module that is maintained substantially free of species that photoabsorb around 157 nm, and a beam path between said optics module and said discharge chamber is sealed from ambient air to maintain said beam path substantially free of said species that photoabsorb around 157 nm.

67. The laser of claim 66, wherein said optics module is purged with an inert gas having a pressure that is controlled for controlling an index of refraction of said gas for controlling an interferometric spectrum of said interferometric device.

68. The laser of claim 64, further comprising an amplifier for boosting an energy of said laser beam.

69. The laser of claim 64, wherein said interferometric device comprises a pair of opposing reflecting surfaces, and wherein at least a first of said pair of opposing reflecting surfaces is configured such that said first and second opposing reflecting surfaces have a varying optical distance therebetween over an incident beam cross-section which serves to suppress outer portions of said primary line to reduce spectral purity.

70. A $F_2$-laser, comprising:
- a discharge chamber filled with a gas mixture including molecular fluorine for generating a spectral emission including a plurality of closely spaced lines in a wavelength range between 157 nm and 158 nm including a primary line and a secondary line;
- a plurality of electrodes coupled with a power supply circuit for producing a pulsed discharge to energize said molecular fluorine; and
- a resonator including the discharge chamber and an interferometric device for generating a laser beam having a bandwidth of less than 1 pm, said interferometric device being configured for relatively suppressing said secondary line to substantially suppress said secondary line compared with said primary line, thereby selecting said primary line such that said $F_2$-laser emits a single wavelength laser beam having a narrow spectral bandwidth that is less than the bandwidth of a free-running $F_2$-laser to provide a narrow band VUV laser beam.

71. The laser of claim 70, wherein said resonator further comprises a beam expander before said interferometric device for expanding and reducing a divergence of said beam prior to impinging upon said interferometric device.

72. The laser of claim 70, wherein said gas mixture is maintained at a pressure below substantially 2 bar such that said spectral bandwidth is narrower than if said gas mixture were maintained at a pressure greater than 2 bar.

73. The laser of claim 70, wherein said gas mixture is maintained at a pressure below substantially 1.5 bar such that said spectral bandwidth is narrower than if said gas mixture were maintained at a pressure greater than 1.5 bar.

74. The laser of claim 70, wherein said gas mixture is maintained at a pressure below substantially 1 bar such that said spectral bandwidth is narrower than if said gas mixture were maintained at a pressure greater than 1 bar.

75. The laser of claim 70, wherein said interferometric device is disposed within an optics module that is maintained substantially free of species that photoabsorb around 157 nm, and a beam path between said optics module and said discharge chamber is sealed from ambient air to maintain said beam path substantially free of said species that photoabsorb around 157 nm.

76. The laser of claim 75, wherein said optics module is purged with an inert gas having a pressure that is controlled for controlling an index of refraction of said gas for controlling an interferometric spectrum of said interferometric device.

77. The laser of claim 70, further comprising an amplifier for boosting an energy of said laser beam.

78. The laser of claim 70, wherein said interferometric device comprises a pair of opposing reflecting surfaces, and wherein at least a first of said pair of opposing reflecting surfaces is configured such that said first and second opposing reflecting surfaces have a varying optical distance therebetween over an incident beam cross-section which serves to suppress outer portions of said primary line to reduce spectral purity.

79. A $F_2$-laser, comprising:
- a discharge chamber filled with a gas mixture including molecular fluorine for generating a spectral emission including a plurality of closely spaced lines in a wavelength range between 157 nm and 158 nm including a primary line and a secondary line;
- a plurality of electrodes coupled with a power supply circuit for producing a pulsed discharge to energize said molecular fluorine; and a resonator including the discharge chamber, an interferometric device and a dispersive optic for generating a laser beam having a bandwidth of less than 1 pm, said dispersive optic being arranged at a particular orientation for dispersing the plurality of closely-spaced lines including the primary and secondary lines such that only the primary line remains within an acceptance angle of the resonator and any other line(s) including the secondary line are dispersed outside of the acceptance angle of the resonator, said interferometric device being configured for relatively suppressing an unselected portion of said primary line to substantially suppress said unselected portion of said primary line, said dispersive optic and interferometric device thereby selecting and narrowing said primary line such that said $F_2$-laser emits a single wavelength laser beam having a narrow spectral bandwidth that is less than the bandwidth of the primary line of a free-running $F_2$-laser to provide a narrow band VUV laser beam.

80. The laser of claim 79, wherein said resonator further comprises a beam expander before said interferometric device for expanding and reducing a divergence of said beam prior to impinging upon said interferometric device.

81. The laser of claim 79, wherein said interferometric device is disposed within an optics module that is maintained substantially free of species that photoabsorb around 157 nm, and a beam path between said optics module and said discharge chamber is sealed from ambient air to maintain said beam path substantially free of said species that photoabsorb around 157 nm.

82. The laser of claim 81, wherein said optics module is purged with an inert gas having a pressure that is controlled for controlling an index of refraction of said gas for controlling an interferometric spectrum of said interferometric device.

83. The laser of claim 79, further comprising an amplifier for boosting an energy of said laser beam.

84. The laser of claim 79, wherein said interferometric device comprises a pair of opposing reflecting surfaces, and wherein at least a first of said pair of opposing reflecting surfaces is configured such that said first and second opposing reflecting surfaces have a varying optical distance therebetween over an incident beam cross-section which serves to suppress outer portions of said primary line to reduce spectral purity.

\* \* \* \* \*